US009231002B2

(12) United States Patent
Oikawa et al.

(10) Patent No.: US 9,231,002 B2
(45) Date of Patent: Jan. 5, 2016

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Yoshiaki Oikawa, Atsugi (JP); Kenichi Okazaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/263,281

(22) Filed: Apr. 28, 2014

(65) Prior Publication Data

US 2014/0326993 A1    Nov. 6, 2014

(30) Foreign Application Priority Data

May 3, 2013   (JP) ................................. 2013-097195

(51) Int. Cl.
*H01L 29/04* (2006.01)
*H01L 27/12* (2006.01)

(52) U.S. Cl.
CPC ........ *H01L 27/1255* (2013.01); *H01L 27/1225* (2013.01)

(58) Field of Classification Search
CPC ............ H01L 27/1214; H01L 27/1251; H01L 27/3244–27/3297; H01L 29/4908; H01L 51/0508–51/0533; H01L 2924/13069; H01L 29/41733; H01L 29/42384; H01L 29/66265; H01L 29/66742–29/6675; H01L 29/7317; H01L 29/786

See application file for complete search history.

(56) References Cited

U.S. PATENT DOCUMENTS

| 4,829,358 A | 5/1989 | Yamazaki |
| 5,182,661 A | 1/1993 | Ikeda et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — David Vu
*Assistant Examiner* — Cuong Nguyen
(74) *Attorney, Agent, or Firm* — Eric J. Robinson; Robinson Intellectual Property Law Office, P.C.

(57) ABSTRACT

To provide a display device including a capacitor whose charge capacity is increased while improving the aperture ratio, provide a display device including a capacitor whose charge capacity can be increased while improving the transmittance of a pixel portion, and provide a display device which consumes low power, the display device includes a transistor including a first oxide semiconductor film in a channel formation region, a second oxide semiconductor film formed over a surface over which the first oxide semiconductor film is formed, a pixel electrode electrically connected to the transistor, and a light-transmitting capacitor in which a dielectric film is provided between two electrodes of a pair. One electrode corresponds to the second oxide semiconductor film, and the other electrode corresponds to the pixel electrode. The second oxide semiconductor film has a smaller thickness than the first oxide semiconductor film.

23 Claims, 12 Drawing Sheets

(56) References Cited

U.S. PATENT DOCUMENTS

| | | |
|---|---|---|
| 5,289,174 A | 2/1994 | Suzuki |
| 5,299,041 A | 3/1994 | Morin et al. |
| 5,321,535 A | 6/1994 | Ukai et al. |
| 5,365,079 A | 11/1994 | Kodaira et al. |
| 5,418,636 A | 5/1995 | Kawasaki |
| 5,483,366 A | 1/1996 | Atherton |
| 5,517,342 A | 5/1996 | Kim et al. |
| 5,724,107 A | 3/1998 | Nishikawa et al. |
| 5,731,856 A | 3/1998 | Kim et al. |
| 5,744,864 A | 4/1998 | Cillessen et al. |
| 5,745,195 A | 4/1998 | Zhang |
| 6,108,065 A | 8/2000 | Ota et al. |
| 6,160,600 A | 12/2000 | Yamazaki et al. |
| 6,281,953 B1 | 8/2001 | Lee et al. |
| 6,294,274 B1 | 9/2001 | Kawazoe et al. |
| 6,411,357 B1 | 6/2002 | Ting et al. |
| 6,421,101 B1 | 7/2002 | Zhang et al. |
| 6,462,800 B1 | 10/2002 | Kim et al. |
| 6,559,477 B2 | 5/2003 | Tada et al. |
| 6,563,174 B2 | 5/2003 | Kawasaki et al. |
| 6,600,535 B1 | 7/2003 | Tsuda et al. |
| 6,727,522 B1 | 4/2004 | Kawasaki et al. |
| 6,784,949 B1 | 8/2004 | Nagata et al. |
| 6,933,528 B2 | 8/2005 | Itakura et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,106,400 B1 | 9/2006 | Tsuda et al. |
| 7,142,260 B2 | 11/2006 | Yang |
| 7,211,825 B2 | 5/2007 | Shih et al |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,605,898 B2 | 10/2009 | Ochiai et al. |
| 7,674,650 B2 | 3/2010 | Akimoto et al. |
| 7,714,975 B1 | 5/2010 | Yamazaki et al. |
| 7,732,819 B2 | 6/2010 | Akimoto et al. |
| 7,745,798 B2 | 6/2010 | Takahashi |
| 7,773,167 B2 | 8/2010 | Tsai et al. |
| 7,847,904 B2 | 12/2010 | Kimura |
| 7,872,261 B2 | 1/2011 | Ikeda |
| 7,910,490 B2 | 3/2011 | Akimoto et al. |
| 7,932,521 B2 | 4/2011 | Akimoto et al. |
| 8,039,842 B2 | 10/2011 | Jinbo |
| 8,102,476 B2 | 1/2012 | Son et al. |
| 8,274,077 B2 | 9/2012 | Akimoto et al. |
| 8,368,066 B2 | 2/2013 | Yamazaki et al. |
| 8,384,077 B2 | 2/2013 | Yano et al. |
| 8,441,011 B2 | 5/2013 | Yamazaki et al. |
| 8,466,463 B2 | 6/2013 | Akimoto et al. |
| 8,481,373 B2 | 7/2013 | Okabe et al. |
| 8,537,318 B2 | 9/2013 | Kimura |
| 8,610,862 B2 | 12/2013 | Kimura |
| 8,629,069 B2 | 1/2014 | Akimoto et al. |
| 8,669,550 B2 | 3/2014 | Akimoto et al. |
| 8,729,547 B2 | 5/2014 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0140891 A1 | 10/2002 | Tomioka et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0051100 A1 | 3/2004 | Yamazaki et al. |
| 2004/0127038 A1 | 7/2004 | Carcia et al. |
| 2004/0169991 A1 | 9/2004 | Nagata et al. |
| 2004/0183978 A1 | 9/2004 | Jeoung |
| 2005/0007507 A1 | 1/2005 | Ono et al. |
| 2005/0017302 A1 | 1/2005 | Hoffman |
| 2005/0046763 A1 | 3/2005 | Ono et al. |
| 2005/0199959 A1 | 9/2005 | Chiang et al. |
| 2005/0231673 A1 | 10/2005 | Yamazaki et al. |
| 2006/0001817 A1 | 1/2006 | Yamazaki et al. |
| 2006/0035452 A1 | 2/2006 | Carcia et al. |
| 2006/0043377 A1 | 3/2006 | Hoffman et al. |
| 2006/0055859 A1 | 3/2006 | Jin et al. |
| 2006/0091399 A1 | 5/2006 | Lee |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0013820 A1 | 1/2007 | Jeoung |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0164939 A1 | 7/2007 | Miyazaki |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0242888 A1 | 10/2009 | Hosoya |
| 2009/0278122 A1 | 11/2009 | Hosono et al. |
| 2009/0280600 A1 | 11/2009 | Hosono et al. |

(56) References Cited

U.S. PATENT DOCUMENTS

| | | |
|---|---|---|
| 2009/0283762 A1 | 11/2009 | Kimura |
| 2010/0044711 A1 | 2/2010 | Imai |
| 2010/0065844 A1 | 3/2010 | Tokunaga |
| 2010/0084655 A1 | 4/2010 | Iwasaki et al. |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0123136 A1 | 5/2010 | Lee et al. |
| 2010/0163867 A1 | 7/2010 | Yamazaki et al. |
| 2010/0163874 A1 | 7/2010 | Koyama et al. |
| 2010/0289020 A1 | 11/2010 | Yano et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0031492 A1 | 2/2011 | Yamazaki et al. |
| 2011/0032435 A1 | 2/2011 | Kimura |
| 2011/0037068 A1 | 2/2011 | Yamazaki et al. |
| 2011/0084271 A1 | 4/2011 | Yamazaki et al. |
| 2011/0151600 A1* | 6/2011 | Oh .................. 438/23 |
| 2011/0284848 A1 | 11/2011 | Yamazaki |
| 2012/0038618 A1 | 2/2012 | Koyama |
| 2012/0062811 A1 | 3/2012 | Miyake |
| 2012/0108018 A1 | 5/2012 | Okabe et al. |
| 2012/0211745 A1 | 8/2012 | Ueda et al. |
| 2012/0273780 A1 | 11/2012 | Yamazaki et al. |
| 2012/0280230 A1 | 11/2012 | Akimoto et al. |
| 2012/0319107 A1 | 12/2012 | Miyake |
| 2013/0146452 A1 | 6/2013 | Yano et al. |
| 2013/0201420 A1* | 8/2013 | Misaki .................. 349/46 |
| 2013/0328044 A1 | 12/2013 | Yamazaki et al. |
| 2014/0014948 A1 | 1/2014 | Matsukura |
| 2014/0034954 A1 | 2/2014 | Yamazaki et al. |
| 2014/0042432 A1 | 2/2014 | Yamazaki |
| 2014/0042443 A1 | 2/2014 | Yamazaki |
| 2014/0061636 A1 | 3/2014 | Miyake et al. |
| 2014/0061654 A1 | 3/2014 | Yamazaki et al. |
| 2014/0070209 A1 | 3/2014 | Yamazaki et al. |
| 2014/0098334 A1 | 4/2014 | Kimura |
| 2014/0175432 A1 | 6/2014 | Yamazaki et al. |

FOREIGN PATENT DOCUMENTS

| | | |
|---|---|---|
| EP | 2579237 A1 | 4/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-051300 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 | 4/2007 |
| JP | 2007-123861 | 5/2007 |
| JP | 2010-243741 A | 10/2010 |
| JP | 2012-018970 A | 1/2012 |
| WO | WO-01/33292 | 5/2001 |
| WO | WO-2004/114391 | 12/2004 |
| WO | WO-2011/148537 | 12/2011 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", App. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID International Symposium Digest of Technical Papers, May 31, 2009, pp. 983-985.

Kanno.H et al., "White Stacked Electrophosphorecent Organic Light-Emitting Devices Employing MoO3 As a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YBFe2O4, and YB2Fe3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara. H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3. Eng.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

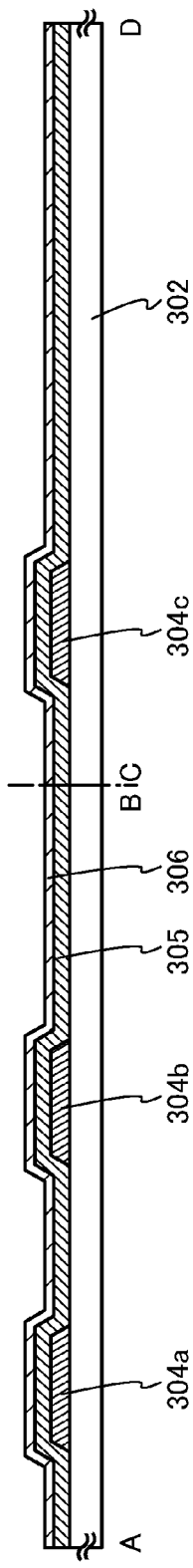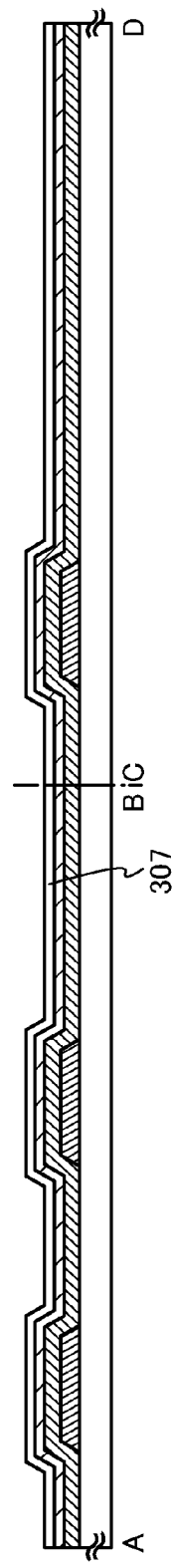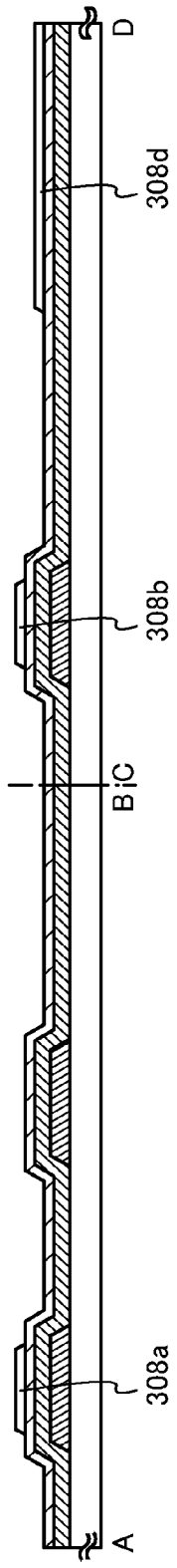

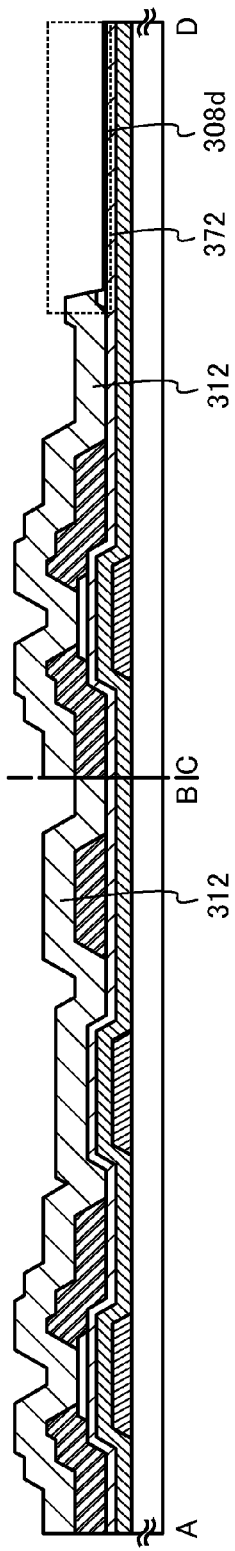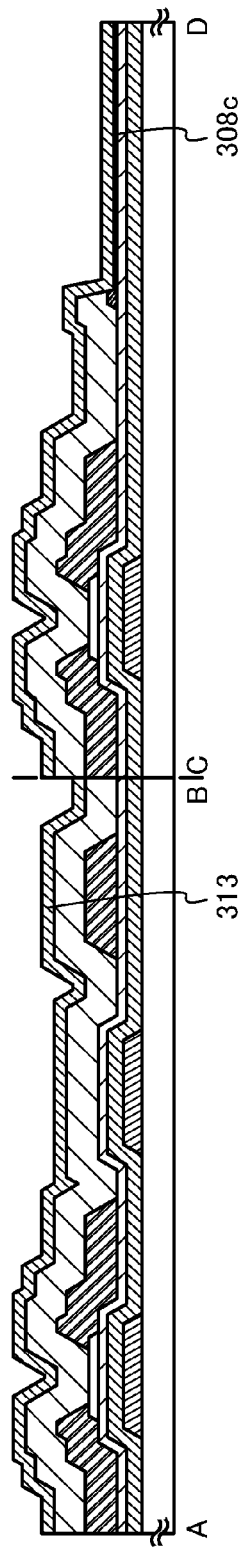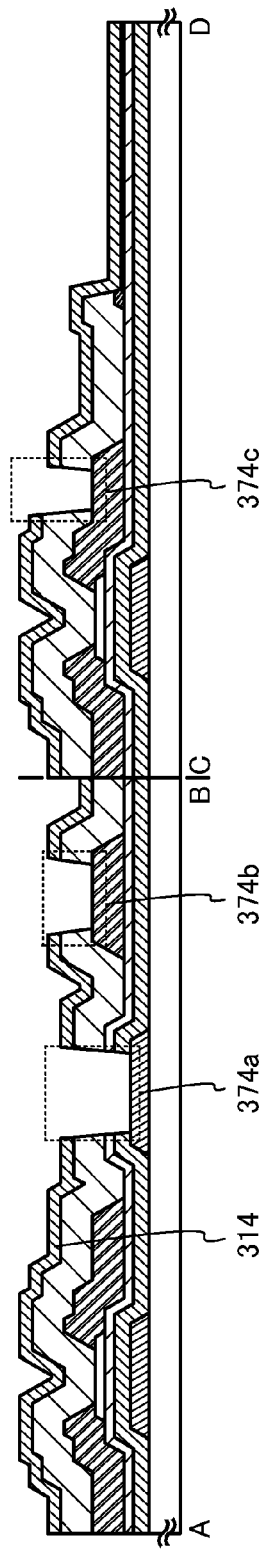

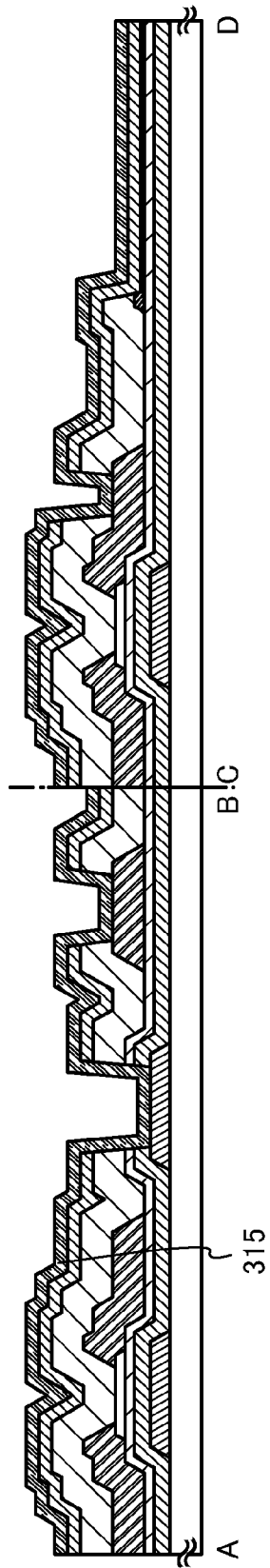
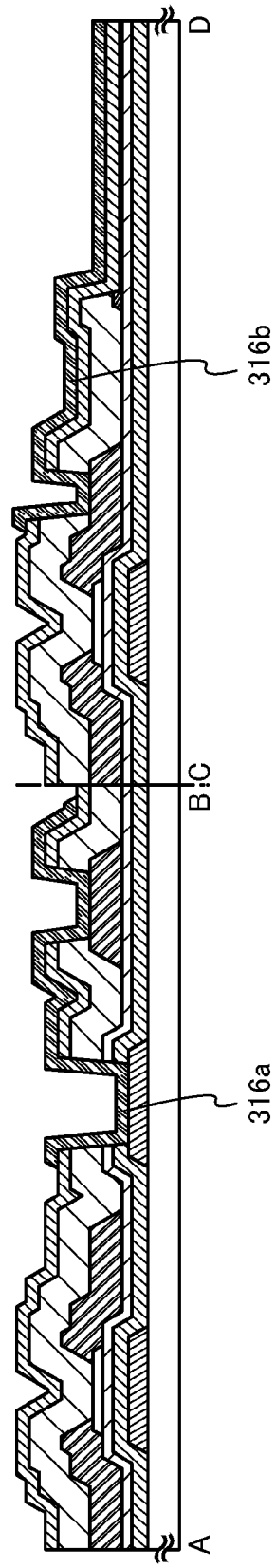
FIG. 7A
FIG. 7B

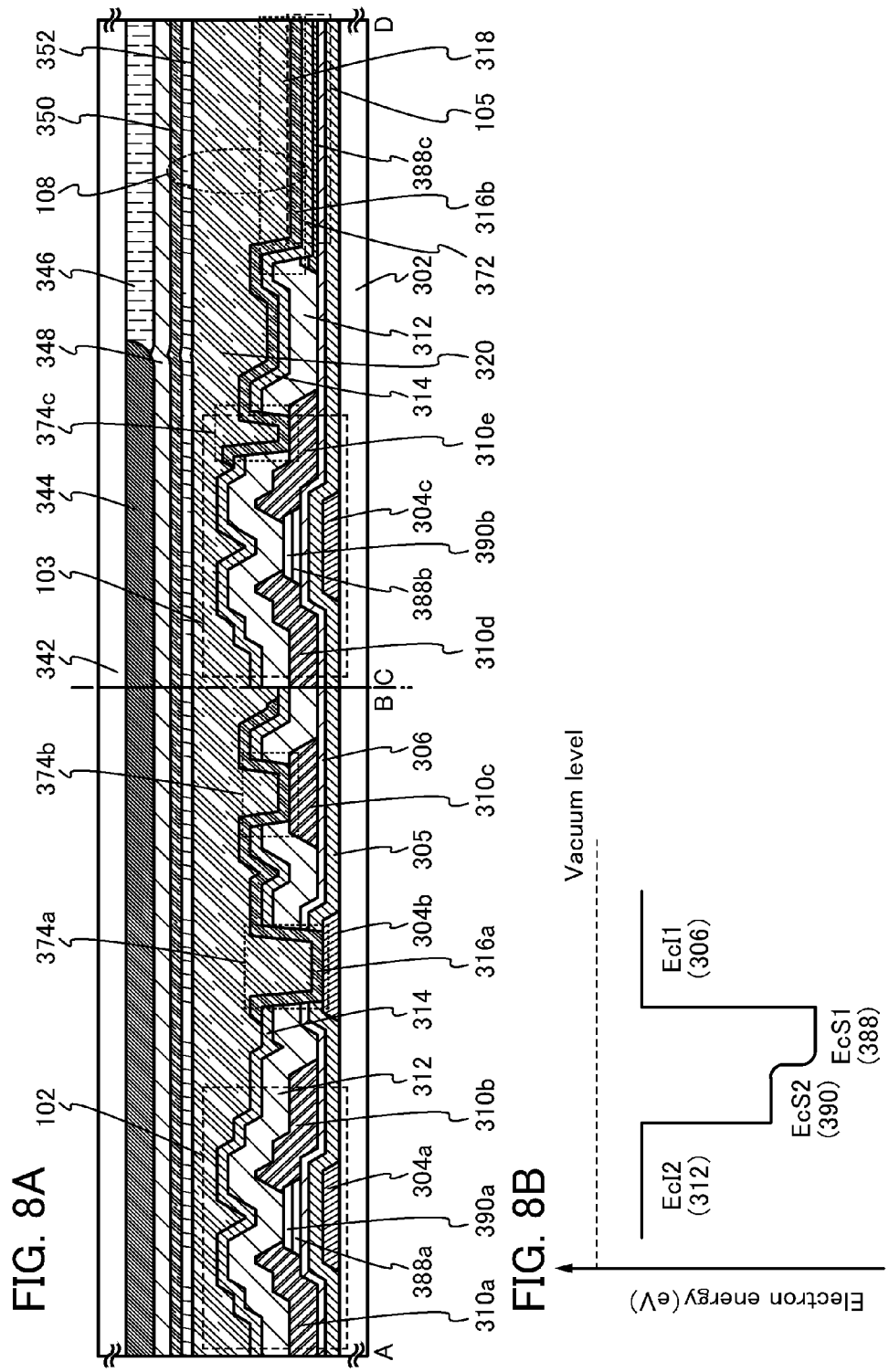

DISPLAY DEVICE AND ELECTRONIC DEVICE

BACKGROUND OF THE INVENTION

1. Field of the Invention

The invention disclosed in this specification and the like relates to a display device and an electronic device including the display device.

2. Description of the Related Art

In recent years, flat panel displays such as liquid crystal displays (LCDs) are becoming widespread. In each of pixels provided in the row direction and the column direction in a display device such as a liquid crystal display, a transistor serving as a switching element, a liquid crystal element electrically connected to the transistor, and a capacitor connected to the liquid crystal element in parallel are provided.

As a semiconductor material of a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, a technique for forming a transistor using zinc oxide or an In—Ga—Zn-based oxide semiconductor is disclosed (see Patent Documents 1 and 2).

A display device which includes a capacitor in which an oxide semiconductor film provided over the surface over which an oxide semiconductor film of a transistor is provided and a pixel electrode connected to the transistor are provided to be separated from each other with a given interval in order to improve the aperture ratio is disclosed (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] U.S. Pat. No. 8,102,476

SUMMARY OF THE INVENTION

In a capacitor, a dielectric film is provided between two electrodes of a pair at least one of which is formed, in many cases, using a light-blocking film partly serving as a gate electrode, a source electrode, a drain electrode, or the like of a transistor.

As the capacitance value of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a portion where two electrodes of the capacitor overlap with each other. However, when the area of a light-blocking conductive film is increased in the display device to increase the area of a portion where the two electrodes overlap with each other, the aperture ratio of a pixel is lowered and thus display quality of an image is degraded.

For example, when the two electrodes are formed using a light-transmitting material, the capacitor can have a larger charge capacity and the pixel can have a higher aperture ratio. However, in the case where the light-transmitting material has a low transmittance, there are following problems: power consumption is increased because of an increase in the amount of light from a light source such as a backlight; and the capacitor is colored, which causes attenuation of light having a particular wavelength, and thus display quality of an image is degraded.

In view of the above problems, an object of one embodiment of the present invention is to provide a display device including a capacitor whose charge capacity is increased while improving the aperture ratio. Another object of one embodiment of the present invention is to provide a display device including a capacitor whose charge capacity can be increased while improving the transmittance of a pixel portion. Furthermore, another object of one embodiment of the present invention is to provide a display device which consumes low power.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a transistor including a first oxide semiconductor film in a channel formation region, a second oxide semiconductor film formed over a surface over which the first oxide semiconductor film is formed, a pixel electrode electrically connected to the transistor, and a light-transmitting capacitor in which a dielectric film is provided between two electrodes a pair. One electrode corresponds to the second oxide semiconductor film, and the other electrode corresponds to the pixel electrode. The second oxide semiconductor film has a smaller thickness than the first oxide semiconductor film.

The transmittance of the capacitor can be improved in such a manner that the second oxide semiconductor film serving as the one electrode of the pair of electrodes of the light-transmitting capacitor is formed to have a smaller thickness than the first oxide semiconductor film used in the channel formation region of the transistor. Therefore, it is possible to provide a display device including a capacitor whose charge capacity can be increased while improving the transmittance of a pixel portion. Moreover, since the thickness of the first oxide semiconductor film used in the channel formation region of the transistor can be optimized, a highly reliable display device can be obtained.

Another embodiment of the present invention is a display device including a transistor including a first oxide semiconductor film in a channel formation region, a first oxide film formed over the first oxide semiconductor film, a second oxide semiconductor film formed over a surface over which the first oxide semiconductor film is formed, a second oxide film formed over the second oxide semiconductor film, a pixel electrode electrically connected to the transistor, and a light-transmitting capacitor in which a dielectric film is provided between two electrodes of a pair. One electrode corresponds to the second oxide semiconductor film and the second oxide film, and the other electrode corresponds to the pixel electrode. The second oxide film has a smaller thickness than the first oxide film.

The transmittance of the capacitor can be improved in such a manner that the second oxide film serving as part of the one electrode of the light-transmitting capacitor is formed to have a smaller thickness than the first oxide film used in the channel formation region of the transistor. Therefore, it is possible to provide a display device including a capacitor whose charge capacity can be increased while improving the transmittance of a pixel portion.

Another embodiment of the present invention is a display device including a transistor including a first oxide semiconductor film in a channel formation region, a first oxide film formed over the first oxide semiconductor film, a second oxide semiconductor film formed over a surface over which the first oxide semiconductor film is formed, a pixel electrode electrically connected to the transistor, and a light-transmitting capacitor in which a dielectric film is provided between two electrodes of a pair. One electrode corresponds to the second oxide semiconductor film, and the other electrode corresponds to the pixel electrode.

The one electrode of the light-transmitting capacitor corresponds to the second oxide semiconductor film, and has a single-layer structure, which differs from the stacked-layer structure of the first oxide semiconductor film used in the channel formation region of the transistor and the first oxide film formed over the first oxide semiconductor film. Therefore, it is possible to provide a display device including a capacitor whose charge capacity can be increased while improving the transmittance of a pixel portion. Moreover, since the first oxide film is formed over the first oxide semiconductor film in the transistor, a highly reliable display device can be obtained.

According to one embodiment of the present invention, it is possible to provide a display device including a capacitor whose charge capacity can be increased while improving the aperture ratio. It is possible to provide a display device including a capacitor whose charge capacity can be increased while improving the transmittance of a pixel portion. Furthermore, it is possible to provide a display device which consumes low power.

BRIEF DESCRIPTION OF THE DRAWINGS

FIGS. 4A to 4C are cross-sectional views illustrating a method for manufacturing a display device.

FIGS. 6A to 6C are cross-sectional views illustrating a method for manufacturing a display device.

FIGS. 7A and 7B are cross-sectional views illustrating a method for manufacturing a display device.

FIGS. 8A and 8B are a cross-sectional view and a band diagram illustrating one embodiment of a display device.

DETAILED DESCRIPTION OF THE INVENTION

Figure 1A:
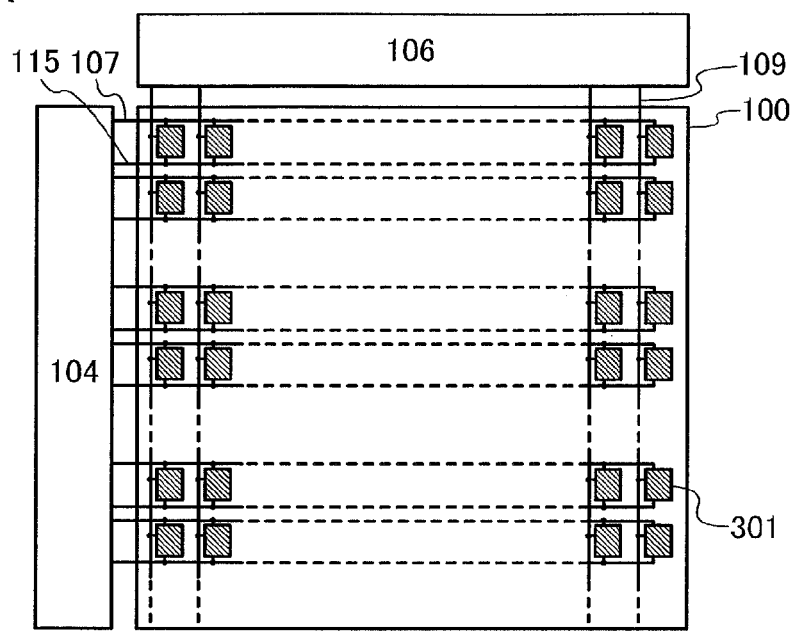
FIGS. 1A and 1B are a block diagram and a circuit diagram illustrating one embodiment of a display device.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments.

In structures of the present invention described below, the same portions or portions having similar functions are denoted by the same reference numerals in different drawings, and description thereof is not repeated. Furthermore, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such a scale.

The ordinal numbers such as "first" and "second" in this specification and the like are used for convenience and do not indicate the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Functions of a "source" and a "drain" in one embodiment of the present invention are sometimes replaced with each other when the direction of current flow is changed in circuit operation, for example. Therefore, the terms "source" and "drain" can be replaced with each other in this specification.

Embodiment 1

In this embodiment, a display device of one embodiment of the present invention is described with reference to drawings. Note that in this embodiment, a liquid crystal display device will be described as an example of the display device of one embodiment of the present invention.

<Structure of Display Device>

FIG. 1A illustrates an example of a display device. The display device illustrated in FIG. 1A includes a pixel portion 100, a scan line driver circuit 104, a signal line driver circuit 106, m scan lines 107 which are arranged parallel or substantially parallel to each other and whose potentials are controlled by the scan line driver circuit 104, and n signal lines 109 which are arranged parallel or substantially parallel to each other and whose potentials are controlled by the signal line driver circuit 106. In addition, the pixel portion 100 includes a plurality of pixels 301 arranged in a matrix. Furthermore, capacitor lines 115 which are arranged parallel or substantially parallel to each other are provided along the scan lines 107. Note that the capacitor lines 115 may be arranged parallel or substantially parallel to each other along the signal lines 109. The scan line driver circuit 104 and the signal line driver circuit 106 are collectively referred to as a driver circuit portion in some cases. Although the capacitor lines 115 are connected to the scan line driver circuit 104 in FIG. 1A, the structure is not limited to this example. For example, the capacitor lines 115 are not necessarily connected to the scan line driver circuit 104.

Each of the scan lines 107 is electrically connected to the n pixels 301 arranged in the corresponding row among the plurality of pixels 301 arranged in m rows and n columns in the pixel portion 100. Each signal line 109 is electrically connected to the m pixels 301 in the corresponding column among the pixels 301 arranged in m rows and n columns. Note also that m and n are individually an integer of 1 or more. Each capacitor line 115 is electrically connected to the n pixels 301 in the corresponding row among the pixels 301 arranged in m rows and n columns. Note that in the case where the capacitor lines 115 are arranged parallel or substantially parallel to each other along the signal lines 109, each capacitor line 115 is electrically connected to the m pixels 301 in the corresponding column among the pixels 301 arranged in m rows and n columns.

Figure 1B:
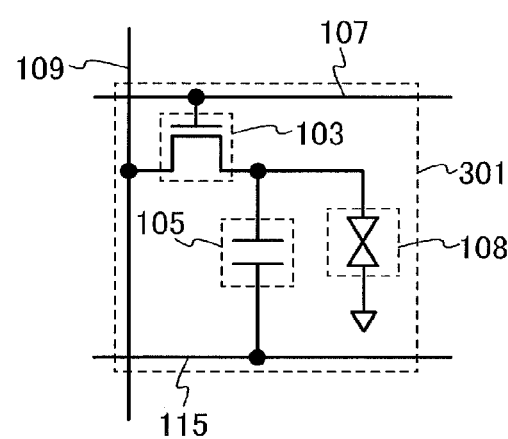

FIG. 1B is an example of a circuit diagram of a pixel 301 included in the display device illustrated in FIG. 1A. The pixel 301 illustrated in FIG. 1B includes a transistor 103 electrically connected to the scan line 107 and the signal line 109, a capacitor 105 one electrode of which is electrically connected to a drain of the transistor 103 and the other electrode of which is electrically connected to the capacitor line 115 which supplies a constant potential, and a liquid crystal element 108. A pixel electrode of the liquid crystal element 108 is electrically connected to the drain electrode of the transistor 103 and the one electrode of the capacitor 105, and an electrode (counter electrode) facing the pixel electrode is electrically connected to a wiring which supplies a counter potential.

The liquid crystal element 108 is an element which controls transmission or non-transmission of light by an optical modulation action of liquid crystal which is sandwiched between a substrate provided with the transistor 103 and the pixel electrode and a substrate provided with a counter electrode. The liquid crystal element 108 is an element which controls transmission or non-transmission of light by an optical modulation action of liquid crystal which is sandwiched between a substrate provided with the transistor 103, the pixel electrode, and a counter electrode and a sealing substrate. The optical modulation action of liquid crystal is controlled by an electric field (including a vertical electric field and a diagonal electric field) applied to the liquid crystal. Note that in the case where a counter electrode (also referred to as a common electrode) is provided over a substrate provided with a pixel electrode, an electric field applied to liquid crystal is a transverse electric field.

Note that the liquid crystal element 108 can be used not only as a liquid crystal element but also as various elements such as a display element and a light-emitting element. Examples of a display element, a light-emitting element, or the like include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometic modulator display (IMOD), a piezoelectric ceramic display, or a carbon nanotube, which are display media whose contrast, luminance, reflectivity, transmittance, or the like is changed by electromagnetic action. Note that examples of display devices having EL elements include an EL display. Display devices having electron emitters include a field emission display (FED), an SED-type flat panel display (SED: surface-conduction electron-emitter display), and the like. Examples of display devices having liquid crystal elements are a transmissive liquid crystal display device, a transflective liquid crystal display device, a reflective liquid crystal display device, a direct-view liquid crystal display device, and a projection liquid crystal display. Examples of a display device having electronic ink or an electrophoretic element include electronic paper.

Figure 2A:
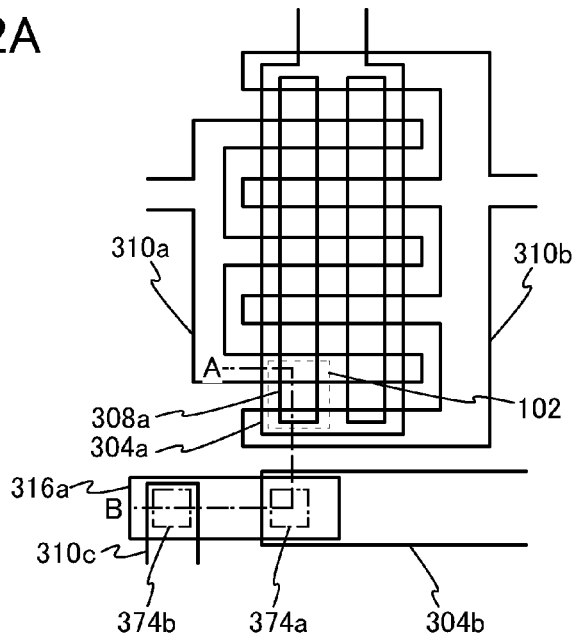
FIGS. 2A and 2B are top views each illustrating one embodiment of a display device.
Figure 2B:
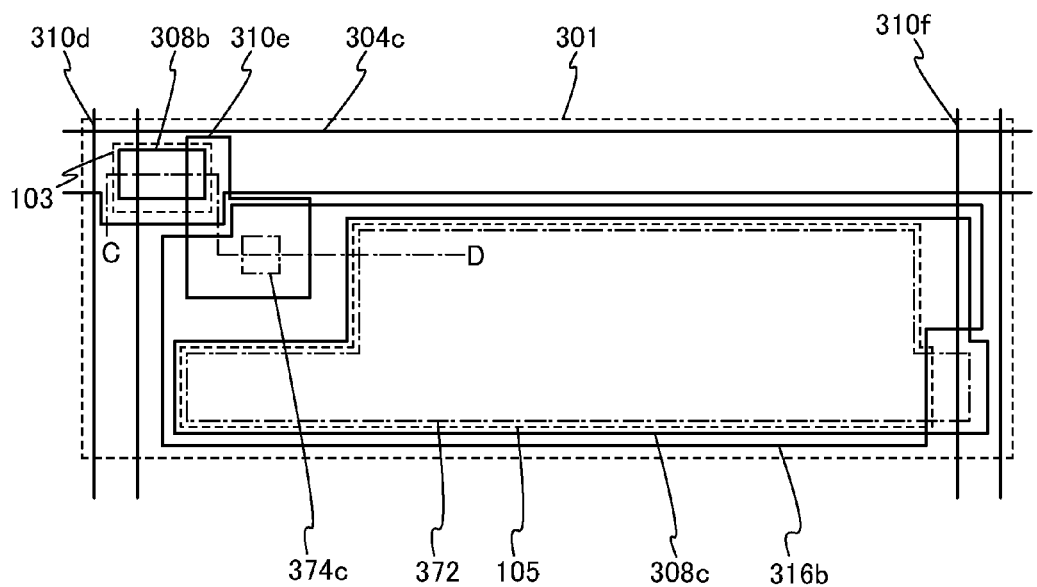

Next, a specific example of the pixel 301 of the liquid crystal display device is described. Here, FIG. 2A is a top view of part of the scan line driver circuit 104, and FIG. 2B is a top view of part of the pixel 301. Note that in FIGS. 2A and 2B, the counter electrode and the liquid crystal element are not illustrated.

In FIG. 2A, a transistor 102 includes a conductive film 304a functioning as a gate, a gate insulating film (not illustrated in FIG. 2A), an oxide semiconductor film 308a where a channel formation region is formed, and conductive films 310a and 310b functioning as a source and a drain. The oxide semiconductor film 308a is formed over the gate insulating film. In addition, a conductive film 304b formed at the same time as the conductive film 304a, a conductive film 310c formed at the same time as the conductive films 310a and 310b, and a light-transmitting conductive film 316a that connects the conductive film 304b to the conductive film 310c are provided. The light-transmitting conductive film 316a is connected to the conductive film 304b in an opening 374a and is connected to the conductive film 310c in an opening 374b.

In FIG. 2B, a conductive film 304c functioning as the scan line 107 extends substantially perpendicularly to the signal line 109 (in the horizontal direction in the drawing). A conductive film 310d functioning as the signal line 109 extends substantially perpendicularly to the scan line 107 (in the vertical direction in the drawing). A conductive film 310f functioning as the capacitor line 115 extends parallel to the signal line 109. Note that the conductive film 304c functioning as the scan line 107 is electrically connected to the scan line driver circuit 104 (see FIG. 1A), and the conductive film 310d functioning as the signal line 109 and the conductive film 310f functioning as the capacitor line 115 are electrically connected to the signal line driver circuit 106. Although FIG. 1A illustrates the structure in which the capacitor lines 115 are connected to the scan line driver circuit 104, the capacitor lines 115 may be connected to the signal line driver circuit 106 as shown in FIG. 2B.

The transistor 103 is provided in a region where the scan line 107 and the signal line 109 cross each other. The transistor 103 includes the conductive film 304c functioning as a gate, the gate insulating film (not illustrated in FIG. 2B), an oxide semiconductor film 308b which is formed over the gate insulating film and in which a channel formation region is formed, and the conductive film 310d and a conductive film 310e functioning as a source and a drain. The conductive film 304c also functions as the scan line, and a region of the conductive film 304c which overlaps with the oxide semiconductor film 308b functions as the gate of the transistor 103. Moreover, the conductive film 310d also functions as the signal line, and a region of the conductive film 310d which overlaps with the oxide semiconductor film 308b serves as the source or drain of the transistor 103. Furthermore, in the top view of FIG. 2B, an end portion of the scan line is located on the outer side than an end portion of the oxide semiconductor film 308b. Thus, the scan line functions as a light-blocking film for blocking light from a light source such as a backlight. For this reason, the oxide semiconductor film 308b included in the transistor 103 is not irradiated with light, so that a change in the electrical characteristics of the transistor 103 can be suppressed.

The conductive film 310e is electrically connected to a light-transmitting conductive film 316b functioning as a pixel electrode in an opening 374c.

The capacitor 105 is connected to the conductive film 310f functioning as the capacitor line 115 in an opening 372. The capacitor 105 includes a light-transmitting conductive film 308c formed over the gate insulating film, the light-transmitting conductive film 316b functioning as a pixel electrode, and a dielectric film formed of a nitride insulating film formed over the transistor 103. That is, the capacitor 105 transmits light.

Since the capacitor 105 has a light-transmitting property as described above, the large capacitor 105 can be formed (covers a large area) in the pixel 301. Thus, the aperture ratio can be improved and can be, typically, 55% or more, preferably 60% or more. Moreover, a display device having a larger charge capacity can be obtained. For example, in a liquid crystal display device with a high resolution, the area of a pixel becomes small and thus the area of a capacitor also becomes small. For this reason, the capacity of charge stored in the capacitor becomes small in the high-resolution display device. However, since the capacitor 105 of this embodiment transmits light, when it is provided in a pixel, sufficient charge capacity can be obtained in the pixel and the aperture ratio can be improved. Typically, the capacitor 105 can be favorably used for a high-resolution display device with a pixel density of 200 pixels per inch (ppi) or more, or furthermore, 300 ppi or more.

In addition, the thickness of the light-transmitting conductive film 308c serving as one electrode of the capacitor 105 is smaller than those of the oxide semiconductor films 308a and 308b of the transistors 102 and 103, respectively. Therefore, the transmittance of the capacitor 105 can be improved.

The pixel 301 illustrated in FIG. 2B has a shape in which a side parallel to the conductive film 304c functioning as the scan line is longer than a side parallel to the conductive film 310d functioning as the signal line, and the conductive film 310f functioning as a capacitor line extends parallel to the conductive film 310d functioning as the signal line. As a result, the area where the conductive film 310f occupies the pixel 301 can be decreased, thereby improving the aperture ratio. In addition, the conductive film 310f functioning as the capacitor line is in direct contact with the light-transmitting conductive film 308c without a connection electrode and thus the aperture ratio can be further improved.

Furthermore, according to one embodiment of the present invention, the aperture ratio can be improved and pixels can have a high transmittance even in a display device with a high resolution, which makes it possible to use efficiently light from a light source such as a backlight, so that power consumption of the display device can be reduced.

Figure 3A:
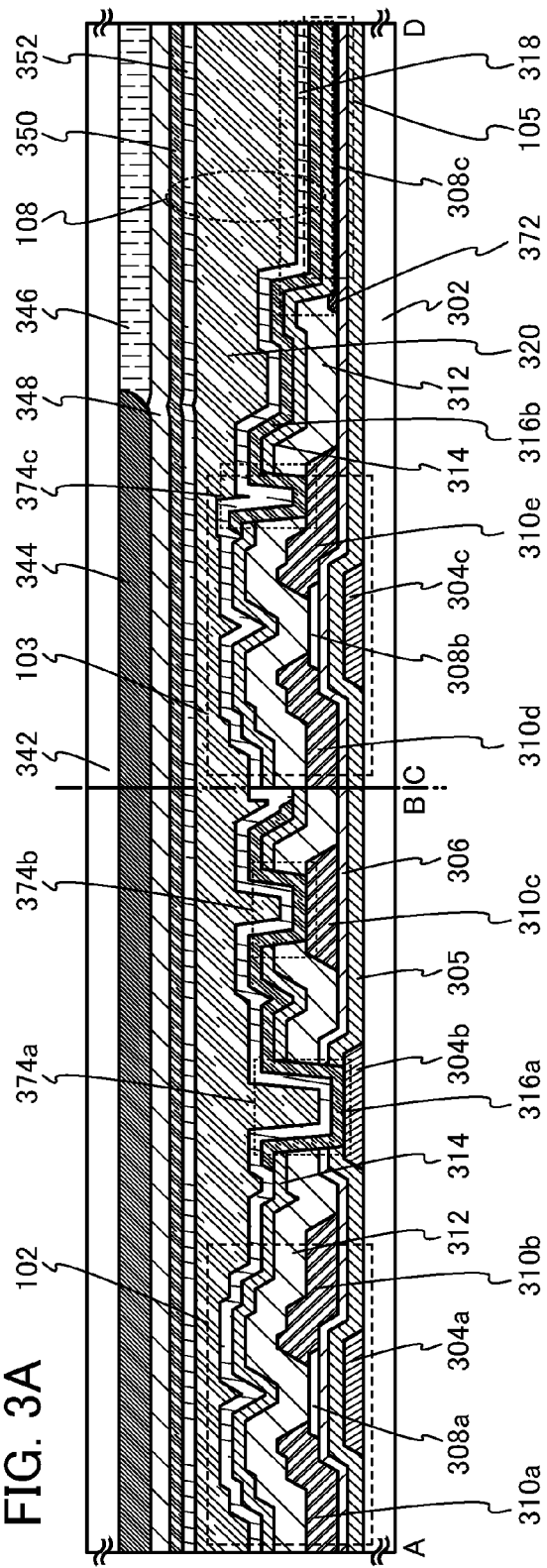
FIGS. 3A and 3B are cross-sectional views illustrating one embodiment of a display device.

Next, FIG. 3A is a cross-sectional view taken along dashed-dotted lines A-B and C-D in FIGS. 2A and 2B.

In the display device described in this embodiment, which is illustrated in FIG. 3A, a liquid crystal element 108 is provided between a pair of substrates (a substrate 302 and a substrate 342).

The liquid crystal element 108 includes the light-transmitting conductive film 316b over the substrate 302, films controlling alignment (hereinafter referred to as alignment films 318 and 352), a liquid crystal layer 320, and a conductive film 350. Note that the light-transmitting conductive film 316b functions as one electrode of the liquid crystal element 108, and the conductive film 350 functions as the other electrode of the liquid crystal element 108.

As a driving method of the display device including the liquid crystal element, any of the following modes can be used: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an IPS mode, an FFS mode, a TBA (transverse bend alignment) mode, and the like. Other examples of the driving method of the display device including the liquid crystal element include ECB (electrically controlled birefringence) mode, PDLC (polymer dispersed liquid crystal) mode, PNLC (polymer network liquid crystal) mode, and a guest-host mode. Note that the present invention is not limited to this, and various driving methods can be used as the driving method of the display device including the liquid crystal element.

The liquid crystal element may be formed using a liquid crystal composition including liquid crystal exhibiting a blue phase and a chiral material. The liquid crystal exhibiting a blue phase has a short response time of 1 ms or less and is optically isotropic, which makes the alignment process unneeded and the viewing angle dependence small.

In this embodiment, a liquid crystal display device of a vertical electric field mode is described.

Thus, a "liquid crystal display device" refers to a device including a liquid crystal element. The liquid crystal display device includes a driver circuit for driving a plurality of pixels, for example. The liquid crystal display device may also be referred to as a liquid crystal module including a control circuit, a power supply circuit, a signal generation circuit, a backlight module, and the like provided over another substrate.

In the driver circuit portion, the transistor 102 includes the conductive film 304a functioning as a gate, insulating films 305 and 306 collectively functioning as a gate insulating film, the oxide semiconductor film 308a in which a channel formation region is formed, and the conductive films 310a and 310b each functioning as a source or a drain. The oxide semiconductor film 308a is formed over the gate insulating film. Furthermore, insulating films 312 and 314 are provided as protective films over the oxide semiconductor film 308a and the conductive films 310a and 310b.

In the pixel portion, the transistor 103 includes the conductive film 304c functioning as a gate, the insulating films 305 and 306 collectively functioning as a gate insulating film, the oxide semiconductor film 308b which is formed over the gate insulating film and in which a channel formation region is formed, and the conductive films 310d and 310e each functioning as a source or a drain. The oxide semiconductor film 308b is formed over the gate insulating film. Furthermore, the insulating films 312 and 314 are provided as protective films over the oxide semiconductor film 308b and the conductive films 310d and 310e.

In the pixel portion, the light-transmitting conductive film 316b functioning as a pixel electrode is connected to the conductive film 310e in an opening provided in the insulating films 312 and 314.

Furthermore, the capacitor 105 includes the light-transmitting conductive film 308c functioning as one electrode of the capacitor 105, the insulating film 314 functioning as a dielectric film of the capacitor 105, and the light-transmitting conductive film 316b functioning as the other electrode of the capacitor 105. The light-transmitting conductive film 308c is provided over the gate insulating film. As described above, the light-transmitting conductive film 316b functions as a pixel electrode and the other electrode of the capacitor 105.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

In the display device of this embodiment, one electrode of the capacitor is formed at the same time as the oxide semiconductor film of the transistor. In addition, the light-transmitting conductive film functioning as a pixel electrode is used as the other electrode of the capacitor. Thus, a step of forming another conductive film is not needed to form the capacitor, and the number of steps of manufacturing the display device can be reduced. Moreover, since the capacitor has a pair of electrodes formed of the light-transmitting conductive film, it can have a light-transmitting property. As a result, the area occupied by the capacitor can be increased and the aperture ratio in a pixel can be improved.

The light-transmitting conductive film 308c is an oxide semiconductor film formed at the same time as the oxide semiconductor films 308a and 308b. The oxide semiconductor films 308a and 308b (first portion of the oxide semiconductor film) are in contact with the films each formed using a material which can improve characteristics of the interface with the oxide semiconductor films, such as the insulating film 306 and the insulating film 312. Thus, the oxide semiconductor films 308a and 308b function as semiconductors, so that the transistors including the oxide semiconductor films 308a and 308b have excellent electrical characteristics.

The light-transmitting conductive film 308c (second portion of the oxide semiconductor film) is in contact with the insulating film 314 in the opening 372. The insulating film 314 is formed using a material which prevents diffusion of impurities from the outside, such as water, an alkali metal, and an alkaline earth metal, into the oxide semiconductor film, and the material further contains hydrogen. Thus, when hydrogen contained in the insulating film 314 is diffused into the light-transmitting conductive film 308c formed at the same time as the oxide semiconductor films 308a and 308b, hydrogen is bonded to oxygen and electrons serving as carriers are generated in the light-transmitting conductive film 308c. As a result, the light-transmitting conductive film 308c has high conductivity to function as a conductor. In other words, the light-transmitting conductive film 308c can be referred to as an oxide semiconductor film with high conductivity.

In addition, the thickness of the light-transmitting conductive film 308c is smaller than those of the oxide semiconductor films 308a and 308b of the transistors 102 and 103, respectively. Therefore, the transmittance of the capacitor 105 can be improved. The light-transmitting conductive film 308c can have a smaller thickness than the oxide semiconductor films 308a and 308b by being processed at the same time as formation of the opening 372.

Figure 3B:
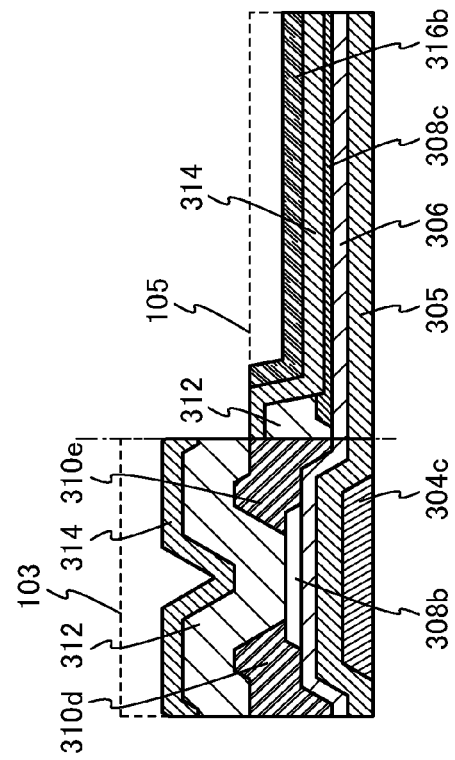

Here, an enlarged cross-sectional view of the display device illustrated in FIG. 3A is shown in FIG. 3B. FIG. 3B is a cross-sectional view in which the transistor 103 and the capacitor 105 illustrated in FIG. 3A are partly enlarged.

As illustrated in FIG. 3B, the thickness of the light-transmitting conductive film 308c of the capacitor 105 is smaller than that of the oxide semiconductor film 308b of the transistor 103. The thickness of the light-transmitting conductive film 308c is preferably one at which the light-transmitting conductive film 308c has conductivity to be able to function as the electrode of the capacitor 105 and at which the transmittance of the capacitor can be improved. The thickness of the light-transmitting conductive film 308c is, for example, two thirds or less, preferably half or less that of the oxide semiconductor film 308b.

Next, the characteristics of a transistor including an oxide semiconductor are described. The transistor including an oxide semiconductor is an n-channel transistor. Further, oxygen vacancies in the oxide semiconductor might generate carriers, which might degrade the electrical characteristics and reliability of the transistor. For example, in the case of the n-channel transistor, the threshold voltage of the transistor shifts in the negative direction, and drain current flows when the gate voltage is 0 V. A transistor in which drain current flows when the gate voltage is 0 V is referred to as normally-on characteristics, and a transistor having such characteristics is referred to as a depletion-type transistor. The characteristics of a transistor in which substantially no drain current flows when the gate voltage is 0 V are referred to as normally-off characteristics, and a transistor having such characteristics is referred to as an enhancement-type transistor.

In the oxide semiconductor films 308a and 308b in which the channel formation regions of the transistors 102 and 103 are formed, respectively, defects, typically oxygen vacancies, are preferably reduced as much as possible. When the defects, typically the oxygen vacancies in the oxide semiconductor film, are reduced as much as possible, the transistors 102 and 103 can be prevented from being normally on, leading to an improvement in the electrical characteristics and reliability of the display device. Moreover, power consumption of the display device can be reduced.

The shift of the threshold voltage of a transistor in the negative direction is caused in some cases by hydrogen (including a hydrogen compound such as water) contained in an oxide semiconductor as well as by oxygen vacancies. Hydrogen contained in the oxide semiconductor is reacted with oxygen bonded to a metal atom to be water, and in addition, vacancies (also referred to as oxygen vacancies) are formed in a lattice from which oxygen is released (or a portion from which oxygen is removed). In addition, when part of hydrogen reacts with oxygen, electrons serving as carriers are generated. Thus, a transistor including an oxide semiconductor which contains hydrogen is likely to be normally on.

In view of the above, in the oxide semiconductor films 308a and 308b in which the channel formation regions of the transistors 102 and 103 are formed, respectively, hydrogen is preferably reduced as much as possible. Specifically, the concentrations of hydrogen in the oxide semiconductor films 308a and 308b, which are measured by secondary ion mass spectrometry, are lower than $5\times10^{19}$ atoms/cm$^3$, preferably lower than $5\times10^{18}$ atoms/cm$^3$, still preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

The concentrations of alkali metals or alkaline earth metals in the oxide semiconductor films 308a and 308b of the transistors 102 and 103, respectively, in each of which a channel formation region is formed, which are measured by secondary ion mass spectrometry, are lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistors 102 and 103 might be increased.

When the oxide semiconductor films 308a and 308b are highly purified in this manner by reducing impurities (such as hydrogen, nitrogen, an alkali metal, and an alkaline earth metal) therein as much as possible, the transistors 102 and 103 becomes enhancement-type transistors and can be prevented from having normally-on characteristics, so that the off-state current of the transistors 102 and 103 can be significantly reduced. Accordingly, a display device having favorable electrical characteristics can be manufactured. Furthermore, a display device with improved reliability can be manufactured.

A variety of experiments can prove a low off-state current of a transistor including a highly-purified oxide semiconductor film. For example, even when an element has a channel width W of $1\times10^6$ μm and a channel length L of 10 μm, an off-state current can be less than or equal to the measurement limit of a semiconductor parameter analyzer, i.e., less than or equal to $1\times10^{-13}$ A, at voltage (drain voltage) between a source and a drain of from 1 V to 10 V. In that case, it can be found that a value obtained by dividing the off-state current by the channel width of the transistor is less than or equal to 100 zA/μm. Furthermore, the off-state current was measured with the use of a circuit in which a capacitor and a transistor are connected to each other and charge that flows in or out from the capacitor is controlled by the transistor. In the measurement, a purified oxide semiconductor film is used for a channel formation region of the transistor, and the off-state current of the transistor is measured from a change in the amount of charge of the capacitor per unit time. As a result, in the case where the voltage between the source and the drain of the transistor is 3 V, a smaller off-state current density of several tens of yoctoamperes per micrometer is obtained. Thus, the transistor including the highly purified oxide semiconductor film has a significantly low off-state current.

On the other hand, the light-transmitting conductive film 308c which is formed through the same steps as the oxide semiconductor films 308a and 308b of the transistors 102 and 103, respectively, contains a large amount of oxygen vacancies and/or has a high hydrogen concentration compared to the oxide semiconductor films 308a and 308b. Therefore, the conductivity of the light-transmitting conductive film 308c can be increased.

Here, other components of the display device illustrated in FIG. 3A are described below.

The conductive films 304a, 304b, and 304c are formed over the substrate 302. The conductive film 304a is formed in the scan line driver circuit 104 and functions as a gate of the transistor in the driver circuit portion. The conductive film 304c is formed in the pixel portion 100 and functions as a gate of the transistor in the pixel portion. The conductive film 304b is formed in the scan line driver circuit 104 and connected to the conductive film 310c through the light-transmitting conductive film 316a.

As the substrate 302, a substrate of a glass material such as aluminosilicate glass, aluminoborosilicate glass, or barium borosilicate glass is used. In terms of mass production, a mother glass with the following size is preferably used for the substrate 302: the 8th generation (2160 mm×2460 mm); the 9th generation (2400 mm×2800 mm, or 2450 mm×3050 mm); the 10th generation (2950 mm×3400 mm); or the like. High process temperature and a long period of process time drastically shrink the mother glass. Thus, in the case where mass production is performed with the use of the mother glass, it is preferable that the heat treatment in the manufacturing process be preferably performed at a temperature lower than or equal to 600° C., further preferably lower than or equal to 450° C., still further preferably lower than or equal to 350° C.

For the conductive films 304a, 304b, and 304c, a metal element selected from aluminum, chromium, copper, tantalum, titanium, molybdenum, and tungsten, an alloy containing any of these metal elements as a component, an alloy containing these metal elements in combination, or the like can be used. The conductive films 304a, 304b, and 304c may have a single-layer structure or a stacked-layer structure including two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, a film, an alloy film, or a nitride film which contains aluminum and one or more elements selected from titanium, tantalum, tungsten, molybdenum, chromium, neodymium, and scandium may be used.

The insulating films 305 and 306 are formed over the substrate 302 and the conductive films 304a, 304b, and 304c. The insulating films 305 and 306 collectively function as a gate insulating film of the transistor 102 in the scan line driver circuit 104 and a gate insulating film of the transistor 103 in the pixel portion 100.

The insulating film 305 is formed using a material which prevents diffusion of impurities from the outside, such as water, an alkali metal, and an alkaline earth metal, into the oxide semiconductor film, and the material further contains hydrogen. The insulating film 305 is typically a nitride insulating film. The nitride insulating film is preferably formed to have a single-layer structure or a stacked-layer structure using any of a silicon nitride film, a silicon nitride oxide film, an aluminum nitride film, and an aluminum nitride oxide film, for example. In the case where the insulating film 305 has a stacked-layer structure, it is preferable that a silicon nitride film with fewer defects be provided as a first silicon nitride film, and a silicon nitride film from which hydrogen is less likely to be released be provided over the first silicon nitride film, as a second silicon nitride film. As a result, transfer or diffusion of hydrogen and nitrogen contained in the insulating film 305 to the oxide semiconductor films 308a and 308b can be suppressed.

Note that silicon oxynitride refers to an insulating material that contains more oxygen than nitrogen. Furthermore, silicon nitride oxide refers to an insulating material that contains more nitrogen than oxygen.

For the insulating film 306, a material which can improve characteristics of the interfaces with the oxide semiconductor films 308a and 308b is preferably used, typically, an inorganic insulating material containing oxygen is preferably used. The insulating film 306 is typically an oxide insulating film. The oxide insulating film is formed to have a single-layer structure or a stacked-layer structure using any of a silicon oxide film, a silicon oxynitride film, an aluminum oxide film, and an aluminum oxynitride film, for example.

The insulating film 306 may be formed using a high-k material such as hafnium silicate ($HfSiO_x$), hafnium silicate containing nitrogen ($HfSi_yO_yN_z$), hafnium aluminate containing nitrogen ($HfAl_xO_yN_z$), hafnium oxide, or yttrium oxide, so that gate leakage current of the transistors 102 and 103 can be reduced.

In addition, a silicon nitride film has a higher dielectric constant than a silicon oxide film and needs a larger thickness for capacitance equivalent to that of the silicon oxide. Thus, the physical thickness of the gate insulating film can be increased. This makes it possible to reduce a decrease in withstand voltage of the transistor and furthermore increase the withstand voltage thereof, thereby reducing electrostatic discharge damage to the transistor.

The oxide semiconductor films 308a and 308b and the light-transmitting conductive film 308c are formed over the insulating film 306. The oxide semiconductor film 308a is formed in a position overlapping with the conductive film 304a and functions as a channel formation region of the transistor 102 in the driver circuit portion. The oxide semiconductor film 308b is formed in a position overlapping with the conductive film 304c and functions as a channel formation region of the transistor 103 in the pixel portion 100. The light-transmitting conductive film 308c functions as one electrode of the capacitor 105.

The oxide semiconductor films 308a and 308b are each an oxide semiconductor film containing In or Ga and typically includes an In—Ga oxide, an In—Zn oxide, and an In-M-Zn oxide (M is an element selected from the group consisting of Al, Ti, Ga, Y, Zr, La, Ce, Nd, and Hf).

In the case of using an In-M-Zn oxide as the oxide semiconductor films 308a and 308b, the proportions of In and M are preferably less than 50 atomic % and greater than or equal to 50 atomic %, respectively, and further preferably less than 25 atomic % and greater than or equal to 75 atomic %, respectively.

The amount of materials contained in the oxide semiconductor films 308a and 308b (e.g., In or Ga) can be compared with each other by time-of-flight secondary ion mass spectrometry (also referred to as TOF-SIMS) or X-ray photoelectron spectrometry (also referred to as XPS).

Since the oxide semiconductor films 308a and 308b each have an energy gap that is 2 eV or more, preferably 2.5 eV or more, further preferably 3 eV or more, the off-state current of the transistor that is formed later can be made low.

The light-transmitting conductive film 308c is an oxide semiconductor film containing In or Ga and contains impurities in a manner similar to those of the oxide semiconductor films 308a and 308b. An example of the impurities is hydrogen. Instead of hydrogen, as the impurity, boron, phosphorus, tin, antimony, a rare gas element, an alkali metal, an alkaline earth metal, or the like may be contained.

Both the oxide semiconductor films 308a and 308b and the light-transmitting conductive film 308c are formed over the gate insulating film and are oxide semiconductor films containing In or Ga, but differ in impurity concentration. Specifically, the light-transmitting conductive film 308c has a higher impurity concentration than the oxide semiconductor films 308a and 308b. For example, the concentration of hydrogen contained in each of the oxide semiconductor films 308a and 308b is lower than $5 \times 10^{19}$ atoms/cm³, preferably lower than $5 \times 10^{18}$ atoms/cm³, still preferably lower than or equal to $1 \times 10^{18}$ atoms/cm³, further preferably lower than or equal to $5 \times 10^{17}$ atoms/cm³, still further preferably lower than or equal to $1 \times 10^{16}$ atoms/cm³. The concentration of hydrogen contained in the light-transmitting conductive film 308c is higher than or equal to $8 \times 10^{19}$ atoms/cm³, preferably higher than or equal to $1 \times 10^{20}$ atoms/cm³, further preferably higher than or equal to $5 \times 10^{20}$ atoms/cm³. The concentration of hydrogen contained in the light-transmitting conductive film 308c is 2 times or more, preferably 10 times or more those in the oxide semiconductor films 308a and 308b.

The light-transmitting conductive film 308c has a lower resistivity than the oxide semiconductor films 308a and 308b. The resistivity of the light-transmitting conductive film 308c is preferably greater than or equal to $1 \times 10^{-8}$ times and less than or equal to $1 \times 10^{-1}$ times the resistivity of the oxide semiconductor films 308a and 308b. The resistivity of the light-transmitting conductive film 308c is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

The oxide semiconductor films 308a and 308b and the light-transmitting conductive film 308c may have a non-single crystal structure, for example. The non-single crystal structure includes a c-axis aligned crystalline oxide semiconductor (CAAC-OS) which is described later, a polycrystalline structure, a microcrystalline structure described later, or an amorphous structure, for example.

Note that the oxide semiconductor films 308a and 308b and the light-transmitting conductive film 308c each may be a mixed film including regions having two or more of the following structures: a CAAC-OS, a microcrystalline structure, and an amorphous structure. The mixed film, for example, includes a region having an amorphous structure, a region having a microcrystalline structure, and a region of a CAAC-OS. Furthermore, the mixed film may have a stacked-layer structure including a region having an amorphous structure, a region having a microcrystalline structure, and a region of a CAAC-OS, for example.

Note that an oxide semiconductor film may be in a single-crystal state, for example.

The conductive films (hereinafter referred to as conductive films 310a, 310b, 310c, 310d, and 310e) are formed over the insulating film 306, the oxide semiconductor films 308a and 308b, and the light-transmitting conductive film 308c. The conductive film 310a is electrically connected to the oxide semiconductor film 308a and functions as one of a source and a drain of the transistor 102 in the driver circuit portion. The conductive film 310b is electrically connected to the oxide semiconductor film 308a and functions as the other of the source and the drain of the transistor 102 in the driver circuit portion. The conductive film 310c is electrically connected to the light-transmitting conductive film 316a through an opening formed in the insulating films 312 and 314. The conductive film 310d is electrically connected to the oxide semiconductor film 308b and functions as one of a source and a drain of the transistor 103 in the pixel portion. The conductive film 310e is electrically connected to the oxide semiconductor film 308b and the light-transmitting conductive film 316b and functions as the other of the source and the drain of the transistor 103 in the pixel portion.

The conductive films 310a, 310b, 310c, 310d, and 310e are formed to have a single-layer structure or a stacked-layer structure using, as a conductive material, any of metals such as aluminum, titanium, chromium, nickel, copper, yttrium, zirconium, molybdenum, silver, tantalum, and tungsten or an alloy containing any of these metals as its main component. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order can be given. Note that a transparent conductive material containing indium oxide, tin oxide, or zinc oxide may be used.

The insulating films 312 and 314 are formed over the insulating film 306, the oxide semiconductor films 308a and 308b, the light-transmitting conductive film 308c, and the conductive films 310a, 310b, 310c, 310d, and 310e. For the insulating film 312, in a manner similar to that of the insulating film 306, a material which can improve characteristics of the interface with the oxide semiconductor films is preferably used. For the insulating film 314, in a manner similar to that of the insulating film 305, a material which prevents diffusion of impurities from the outside, such as water, an alkali metal, and an alkaline earth metal, into the oxide semiconductor films 308a and 308b is preferably used.

Furthermore, the insulating film 312 may be formed using an oxide insulating film which contains oxygen at a higher proportion than oxygen in the stoichiometric composition. In that case, oxygen can be prevented from being released from the oxide semiconductor films 308a and 308b, and oxygen contained in the insulating film 312 can be transferred to the oxide semiconductor films to compensate oxygen vacancies. For example, the oxygen vacancies in the oxide semiconductor films 308a and 308b can be compensated by using an oxide insulating film having the following feature: the number of oxygen molecules released from the oxide insulating film by heat treatment at a temperature higher than or equal to 100° C. and lower or equal to 700° C., preferably higher than or equal to 100° C. and lower than or equal to 500° C. is greater than or equal to $1.0 \times 10^{18}$ molecules/cm$^3$ when measured by thermal desorption spectroscopy (hereinafter referred to as TDS spectroscopy).

In addition, it is possible that the insulating film 312 has a stacked-layer structure in which an oxide insulating film which reduces interface levels with the oxide semiconductor films 308a and 308b is provided as a first oxide insulating film on the side in contact with the oxide semiconductor films 308a and 308b, and an oxide insulating film which contains oxygen at a higher proportion than oxygen in the stoichiometric composition is provided as a second oxide insulating film over the first oxide insulating film.

For example, when the spin density of the first oxide insulating film at a g-value of 2.001 (E'-center) obtained by electron spin resonance is lower than or equal to $3.0 \times 10^{17}$ spins/cm$^3$, preferably lower than or equal to $5.0 \times 10^{16}$ spins/cm$^3$, the interface levels between the first oxide insulating film and each of the oxide semiconductor films 308a and 308b can be reduced. Note that the spin density at a g-value of 2.001 obtained by electron spin resonance corresponds to the number of dangling bonds contained in the first oxide insulating film.

Furthermore, the light-transmitting conductive films 316a and 316b are provided over the insulating film 314. The light-transmitting conductive film 316a is electrically connected to the conductive film 304b in the opening 374a and electrically connected to the conductive film 310c in the opening 374b. That is, the light-transmitting conductive film 316a functions as a connection electrode which connects the conductive film 304b and the conductive film 310c. The light-transmitting conductive film 316b is electrically connected to the conductive film 310e in the opening 374c and functions as the pixel electrode of a pixel. Moreover, the light-transmitting conductive film 316b can function as the other of the pair of electrodes of the capacitor 105.

The light-transmitting conductive films 316a and 316b may include at least one oxide selected from the group consisting of indium oxide, tin oxide, and zinc oxide. For the light-transmitting conductive films 316a and 316b, a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added can be used.

A film having a colored property (hereinafter referred to as a colored film 346) is formed below the substrate 342. The colored film 346 functions as a color filter. Furthermore, a light-blocking film 344 adjacent to the colored film 346 is formed below the substrate 342. The light-blocking film 344 functions as a black matrix. The colored film 346 is not necessarily provided in the case where the display device is a monochrome display device, for example.

The colored film 346 is a colored film that transmits light in a specific wavelength range. For example, a red (R) color filter for transmitting light in a red wavelength range, a green (G) color filter for transmitting light in a green wavelength range, or a blue (B) color filter for transmitting light in a blue wavelength range can be used.

The light-blocking film 344 preferably has a function of blocking light in a specific wavelength range, and can be a metal film or an organic insulating film including a black pigment.

An insulating film 348 is formed below the colored film 346. The insulating film 348 functions as a planarization layer or suppresses diffusion of impurities in the colored film 346 to the liquid crystal element side.

The conductive film 350 is formed on the insulating film 348. The conductive film 350 functions as one electrode of the two electrodes of the liquid crystal element 108 in the pixel portion. Note that the alignment films 318 and 352 are formed in contact with the light-transmitting conductive films 316a and 316b and the conductive film 350, respectively.

The liquid crystal layer 320 is formed between the light-transmitting conductive film 316b and the conductive film 350, specifically between the alignment film 318 and the alignment film 352. The liquid crystal layer 320 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive film 316a and the conductive film 350, and the light-transmitting conductive film 316b and the conductive film 350 to maintain the thickness of the liquid crystal layer 320 (also referred to as a cell gap).

<Method for Manufacturing Display Device>

Next, a formation method of an element portion over the substrate 302 in the display device illustrated in FIG. 3A is described with reference to FIGS. 4A to 4C, FIGS. 5A to 5C, FIGS. 6A to 6C, and FIGS. 7A and 7B.

First, the substrate 302 is prepared. Here, a glass substrate is used as the substrate 302.

Then, a conductive film is formed over the substrate 302 and processed into desired shapes, so that the conductive films 304a, 304b, and 304c are formed. The conductive films 304a, 304b, and 304c can be formed in such a manner that a mask is formed in the desired regions by first patterning and regions not covered with the mask are etched (see FIG. 4A).

The conductive films 304a, 304b, and 304c can be typically formed by an evaporation method, a CVD method, a sputtering method, a spin coating method, or the like. Here, a 100 nm-thick tungsten film is formed as the conductive films 304a, 304b, and 304c by a sputtering method.

Next, the insulating film 305 is formed over the substrate 302 and the conductive films 304a, 304b, and 304c, and then the insulating film 306 is formed over the insulating film 305 (see FIG. 4A).

The insulating films 305 and 306 can be formed by a sputtering method, a CVD method, or the like. Note that it is preferable that the insulating films 305 and 306 be formed in succession in a vacuum, in which case impurities are prevented from entering the interface between the insulating film 305 and insulating film 306. Here, a 400-nm-thick silicon nitride film is formed as the insulating film 305 by a PE PE-CVD method. Furthermore, a 50-nm-thick silicon oxynitride film is formed as the insulating film 306 by a PE-CVD method.

Next, an oxide semiconductor film 307 is formed over the insulating film 306 (see FIG. 4B).

The oxide semiconductor film 307 can be formed by a sputtering method, a coating method, a pulsed laser deposition method, a laser ablation method, or the like.

In the case where the oxide semiconductor film 307 is formed by a sputtering method, an RF power supply device, an AC power supply device, a DC power supply device, or the like can be used as appropriate as a power supply device for generating plasma.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

In the case where the oxide semiconductor film 307 is formed by, for example, a sputtering method, the oxide semiconductor film 307 may be formed while the substrate is heated at the substrate temperature higher than or equal to room temperature (e.g., 20° C.) and lower than 500° C., preferably higher than or equal to 100° C. and lower than or equal to 450° C., further preferably higher than or equal to 150° C. and lower than or equal to 350° C.

In the case where the oxide semiconductor film 307 is formed by a sputtering method, in order to reduce the concentration of hydrogen contained in the oxide semiconductor film 307, each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump which can remove hydrogen or the like, which serves as an impurity for the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In order to reduce the concentration of hydrogen contained in the oxide semiconductor film 307, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. is used, whereby entry of moisture or the like into the oxide semiconductor film can be prevented as much as possible.

Here, an In—Ga—Zn oxide film having a thickness of 35 nm to 100 nm (having an atomic ratio of In to Ga and Zn being 1:1:1) is formed by a sputtering method as the oxide semiconductor film 307.

Next, the oxide semiconductor film 307 is processed into desired shapes, so that the island-shaped oxide semiconductor films 308a and 308b, and an island-shaped oxide semiconductor film 308d are formed (see FIG. 4C).

The oxide semiconductor films 308a, 308b, and 308d can be formed in such a manner that a mask is formed in the desired regions by second patterning and regions not covered with the mask are etched. For the etching, dry etching, wet etching, or a combination of both can be employed.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor that is used for the oxide semiconductor films 308a, 308b, and 308d can be improved, and in addition, impurities such as hydrogen and water can be removed from the insulating film 306 and the oxide semiconductor films 308a, 308b, and 308d. The first heat treatment may be performed before the oxide semiconductor is etched.

Here, the oxide semiconductor films are heated at 350° C. in a nitrogen atmosphere for one hour and then is heated at 350° C. in an oxygen atmosphere for one hour.

Figure 5A:
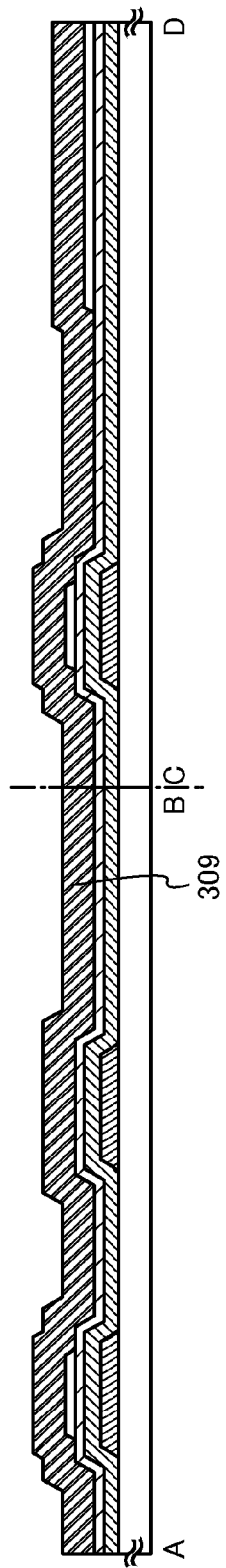
FIGS. 5A to 5C are cross-sectional views illustrating a method for manufacturing a display device.
Figure 5B:
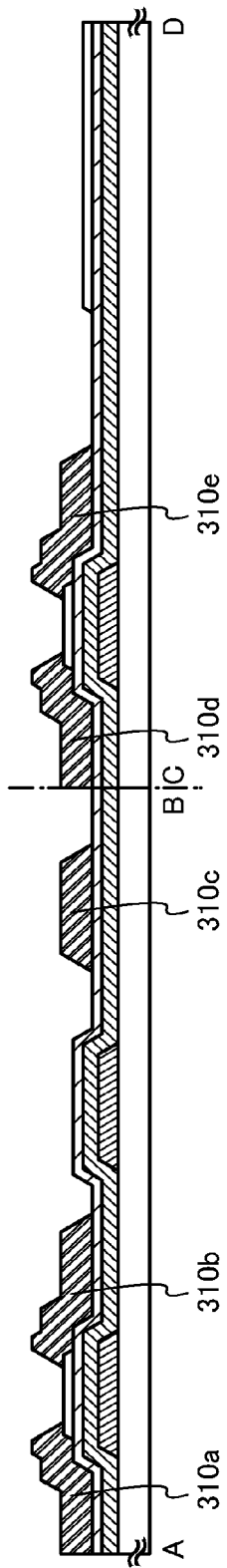

Next, a conductive film 309 is formed over the insulating film 306 and the oxide semiconductor films 308a, 308b, and 308d (see FIG. 5A).

The conductive film 309 can be formed by a sputtering method, for example.

Here, a 50-nm-thick titanium film, a 400-nm-thick aluminum film, and a 100-nm-thick titanium film are stacked in this order by a sputtering method.

Then, the conductive film 309 is processed into desired regions, so that the conductive films 310a, 310b, 310c, 310d, and 310e are formed. The conductive films 310a, 310b, 310c, 310d, and 310e can be formed in such a manner that a mask is formed over the desired regions by third patterning and regions not covered with the mask are etched (see FIG. 5B).

Figure 5C:
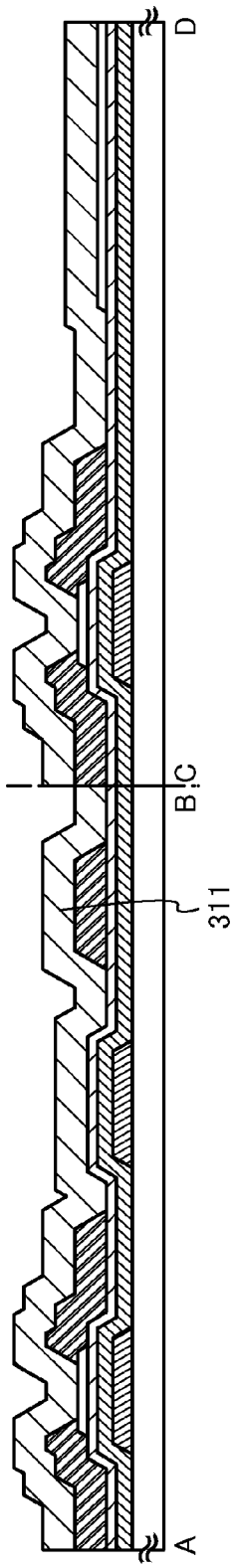

Next, an insulating film 311 is formed to cover the insulating film 306, the oxide semiconductor films 308a, 308b, and 308d, and the conductive films 310a, 310b, 310c, 310d, and 310e (see FIG. 5C).

For the insulating film 311, a material which can improve characteristics of the interface with the oxide semiconductor films 308a, 308b, and 308d is preferably used, typically, an inorganic insulating material containing oxygen, such as an oxide insulating film, can be used. The insulating film 311 can be formed by a PE-CVD method, a sputtering method, or the like.

In the case where the insulating film 311 is formed using an oxide insulating film which contains oxygen at a higher proportion than oxygen in the stoichiometric composition, the insulating film 311 can be formed under the following formation conditions. Here, as the insulating film 311, a silicon oxide film or a silicon oxynitride film is formed. As for the formation conditions, the substrate placed in a treatment chamber of a PE-CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to $0.17$ W/cm$^2$ and lower than or equal to $0.5$ W/cm$^2$, preferably, higher than or equal to $0.25$ W/cm$^2$ and lower than or equal to $0.35$ W/cm$^2$ is supplied to an electrode provided in the treatment chamber.

Typical examples of the deposition gas containing silicon, which is used as a source gas of the insulating film 311, include silane, disilane, trisilane, and silane fluoride. Examples of the oxidizing gas include oxygen, ozone, dinitrogen monoxide, and nitrogen dioxide.

Under the formation conditions of the insulating film 311, the high-frequency power having the above power density is supplied to the treatment chamber having the above pressure; accordingly, the decomposition efficiency of the source gas in plasma is increased, oxygen radicals are increased, and oxidation of the source gas proceeds, whereby the oxygen content in the insulating film 311 becomes higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than oxygen in the stoichiometric composition and from which part of oxygen is released by heating.

In addition, it is possible that the insulating film 311 has a stacked-layer structure in which an oxide insulating film which reduces interface levels at least with the oxide semiconductor films 308a and 308b is provided as a first oxide insulating film, and an oxide insulating film which contains oxygen at a higher proportion than oxygen in the stoichiometric composition is provided as a second oxide insulating film over the first oxide insulating film.

The oxide insulating film which reduces interface levels at least with the oxide semiconductor films 308a and 308b can be formed under the following formation conditions. Here, as the oxide insulating film, a silicon oxide film or a silicon oxynitride film is formed. As for the formation conditions, the substrate placed in a treatment chamber of a PE-CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

The source gas of the first oxide insulating film can be a source gas which can be used for an oxide insulating film which contains oxygen at a higher proportion than oxygen in the stoichiometric composition. In the process for forming the second oxide insulating film, the first oxide insulating film serves as a protective film for at least the oxide semiconductor films 308a and 308b. Thus, even when the second oxide insulating film is formed using the high-frequency power having a high power density, damage to the oxide semiconductor films 308a and 308b can be inhibited.

Here, the insulating film 311 has a stacked-layer structure of the first oxide insulating film and the second oxide insulating film, and as the first oxide insulating film, a 50-nm-thick silicon oxynitride film is formed using a PE-CVD apparatus in which silane with a flow rate of 30 sccm and dinitrogen monoxide with a flow rate of 4000 sccm are used as a source gas, the pressure in the treatment chamber is 200 Pa, the substrate temperature is 220° C., and a high-frequency power of 150 W is supplied to parallel plate electrodes with the use of a 27.12 MHz high-frequency power source. As the second oxide insulating film, a 400-nm-thick silicon oxynitride film is formed using the PE-CVD apparatus in which silane with a flow rate of 200 sccm and dinitrogen monoxide with a flow rate of 4000 sccm are used as a source gas, the pressure in the treatment chamber is 200 Pa, the substrate temperature is 220° C., and the high-frequency power of 1500 W is supplied to the parallel plate electrodes with the use of a 27.12 MHz high-frequency power source. Note that the PE-CVD apparatus is a parallel plate PE-CVD apparatus in which the electrode area is 6000 cm$^2$, and the power per unit area (power density) into which the supplied power is converted is 0.26 W/cm$^2$.

Next, the insulating film 311 is processed into desired shapes, so that the insulating film 312 and the opening 372 are formed. The opening 372 can be formed in such a manner that a mask is formed over the desired regions by fourth patterning and regions not covered with the mask are etched (see FIG. 6A).

The opening 372 is formed so as to expose the oxide semiconductor film 308d. By the formation of the opening 372, the oxide semiconductor film 308d (second portion of the oxide semiconductor film 307) becomes thinner than the oxide semiconductor films 308a and 308b (first portion of the oxide semiconductor film 307). Specifically, the thickness of the oxide semiconductor film 308d is two thirds or less, preferably half or less that of the oxide semiconductor films 308a and 308b. Note that the lower limit of the thickness of the oxide semiconductor film 308d can be, for example, greater than or equal to 5 nm and less than or equal to 50 nm as long as the light-transmitting conductive film 308c to be formed later can function as one electrode of the capacitor in such a range of thickness. With the thickness of the oxide semiconductor film 308d set in the above range, the transmittance of the oxide semiconductor film 308d can be improved than that of the oxide semiconductor films 308a and 308b. Since in this embodiment the oxide semiconductor film 307 is formed with a thickness of 35 nm to 100 nm, the thickness of the oxide semiconductor film 308d can be, for example, greater than or equal to 15 nm and less than or equal to 50 nm.

An example of a formation method of the opening 372 includes, but not limited to, a dry etching method. Alternatively, a wet etching method or a combination of a dry etching method and a wet etching method can be employed for the formation method of the opening 372.

Moreover, although the opening 372 is formed so that the outer edge portion of the oxide semiconductor film 308d is covered by the insulating film 312 in this embodiment, the present invention is not limited to such a structure. For example, the entire surface of the oxide semiconductor film 308d may be exposed to be thinned at the formation of the opening 372.

Next, an insulating film 313 is formed over the insulating film 312 and the oxide semiconductor film 308d. By the formation of the insulating film 313, the oxide semiconductor film 308d becomes the light-transmitting conductive film 308c (see FIG. 6B).

The insulating film 313 is formed using a material which prevents diffusion of impurities from the outside, such as water, an alkali metal, and an alkaline earth metal, into the oxide semiconductor film, and the material further contains hydrogen. Thus, when hydrogen in the insulating film 313 is diffused into the oxide semiconductor film 308d, hydrogen is bonded to oxygen and electrons serving as carriers are generated in the oxide semiconductor film 308d. As a result, the conductivity of the oxide semiconductor film 308d is increased, so that the oxide semiconductor film 308d becomes the light-transmitting conductive film 308c. Whereas, the insulating film 312 is provided between the oxide semiconductor films 308a and 308b, and the insulating film 313; therefore, hydrogen in the insulating film 313 is not diffused or is hardly diffused. For the insulating film 313, a silicon nitride film can be used, for example. The insulating film 313 can be formed by a PE-CVD method, for example.

The silicon nitride film is preferably formed at a high temperature to have an improved blocking property; for example, the silicon nitride film is preferably formed at a temperature in the range from the substrate temperature of 100° C. to the strain point of the substrate, further preferably at a temperature in the range from 300° C. to 400° C. When the silicon nitride film is formed at a high temperature, a phenomenon in which oxygen is released from the oxide semiconductor used for the oxide semiconductor films 308a and 308b and the carrier concentration is increased is caused in some cases; therefore, the upper limit of the temperature is a temperature at which the phenomenon is not caused.

Here, as the insulating film 313, the 50-nm-thick silicon nitride film is formed by a PE-CVD method under the following conditions: silane with a flow rate of 50 sccm, nitrogen with a flow rate of 5000 sccm, and ammonia with a flow rate of 100 sccm are used as a source gas, the pressure in the treatment chamber is 200 Pa, the substrate temperature is 220° C., and high-frequency power of 1000 W (the power density is $1.6 \times 10^{-1}$ W/cm$^2$) is supplied to parallel-plate electrodes with a high-frequency power supply of 27.12 MHz.

Next, the insulating film 313 is processed into desired shapes, so that the insulating film 314 and the openings 374a, 374b, and 374c are formed. The insulating film 314 and the openings 374a, 374b, and 374c can be formed in such a manner that a mask is formed over the desired regions by fifth patterning and regions not covered with the mask are etched (see FIG. 6C).

The opening 374a is formed to expose the conductive film 304a. The opening 374b is formed to expose the conductive film 310c. The opening 374c is formed to expose the conductive film 310e.

An example of a formation method of the openings 374a, 374b, and 374c includes, but not limited to, a dry etching method. Alternatively, a wet etching method or a combination of a dry etching method and a wet etching method can be employed for the formation method of the opening 374a, 374b, and 374c.

Then, a conductive film 315 is formed over the insulating film 314 to cover the openings 374a, 374b, and 374c (see FIG. 7A).

The conductive film 315 can be formed by a sputtering method, for example.

Here, a 100-nm-thick indium tin oxide film to which silicon oxide is added is formed as the conductive film 315 by a sputtering method.

Next, the conductive film 315 is processed into desired shapes, so that the light-transmitting conductive films 316a and 316b are formed. The light-transmitting conductive films 316a and 316b can be formed in such a manner that a mask is formed over the desired regions by sixth patterning and regions not covered with the mask are etched (see FIG. 7B).

Through the above process, the pixel portion and the driver circuit portion including the transistors can be formed over the substrate 302. In the manufacturing process described in this embodiment, the transistors 102 and 103 and the capacitor 105 can be formed at the same time by the first to sixth patterning, that is, with the six masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, an alkali metal, an alkaline earth metal, or the like to the oxide semiconductor film 308d. Hydrogen, boron, phosphorus, tin, antimony, a rare gas element, or the like is added to the oxide semiconductor film 308d by an ion doping method, an ion implantation method, plasma treatment, or the like. Furthermore, an alkali metal, an alkaline earth metal, or the like may be added to the oxide semiconductor film 308d by a method in which the oxide semiconductor film 308d is exposed to a solution that contains the impurity.

Next, a structure that is formed over the substrate 342 provided so as to face the substrate 302 is described below.

First, the substrate 342 is prepared. For materials of the substrate 342, the materials that can be used for the substrate 302 can be referred to. Then, the light-blocking film 344 and the colored film 346 are formed on the substrate 342. The light-blocking film 344 and the colored film 346 are each formed in a desired position with any of various materials by a printing method, an ink-jet method, an etching method using a photolithography technique, or the like.

Next, the insulating film 348 is formed on the light-blocking film 344 and the colored film 346. For the insulating film 348, for example, an organic insulating film of an acrylic-based resin can be used. With the insulating film 348, an impurity or the like contained in the colored film 346 can be prevented from diffusing into the liquid crystal layer 320, for example. Note that the insulating film 348 is not necessarily formed.

Then, the conductive film 350 is formed on the insulating film 348. For a material of the conductive film 350, a material that can be used for the conductive film 315 can be referred to.

Through the above process, the structure formed on the substrate 342 can be formed.

Next, the alignment film 318 is formed over the substrate 302, specifically over the insulating film 314 and the light-transmitting conductive films 316a and 316b formed over the substrate 302, and the alignment film 352 is formed on the substrate 342, specifically on the conductive film 350 provided for the substrate 342. The alignment films 318 and 352 are formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the display device illustrated in FIG. 3A can be manufactured.

Modification Example 1

A display device illustrated in FIG. 8A is an example in which a stack of an oxide semiconductor film 388a and an oxide film 390a and a stack of an oxide semiconductor film 388b and an oxide film 390b are used, respectively, as the oxide semiconductor film 308a of the transistors 102 and the oxide semiconductor film 308b of the transistor 103 included in the above-described display device. Therefore, the other components of such transistors are the same as those of the transistors 102 and 103; hence, the above description can be referred to.

Here, the stack of the oxide semiconductor film 388a and the oxide film 390a and the stack of the oxide semiconductor film 388b and the oxide film 390b are described below in detail.

Metal oxide of the oxide semiconductor films 388a and 388b (in this specification below, also referred to as oxide semiconductor film 388) and metal oxide of the oxide films 390a and 390b (in this specification below, also referred to as oxide film 390) preferably have at least one constituent element in common. Furthermore, the constituent elements of the oxide semiconductor film 388 and the oxide film 390 are made to be the same and the composition of the constituent elements of the oxide semiconductor film 388 and the oxide film 390 may be made to be different.

In the case where the oxide semiconductor film 388 is an In-M-Zn oxide (M is an element selected from the group consisting of Al, Ga, Ge, Y, Zr, Sn, La, Ce, and Hf), it is preferable that the atomic ratio of metal elements of a sputtering target used for forming a film of the In-M-Zn oxide satisfy In≥M and Zn≥M. As the atomic ratio of metal elements of such a sputtering target, the ratio of In to M and Zn is preferably 1:1:1, 5:5:6 (1:1:1.2), 3:1:2, or the like. Note that the proportion of the atomic ratio of the oxide semiconductor film 388 formed using the above-described sputtering target varies within a range of ±20% as an error.

In the case of using an In-M-Zn oxide for the oxide semiconductor film 388, when Zn and O are eliminated from consideration, the proportion of In and the proportion of M are preferably greater than or equal to 25 atomic % and less than 75 atomic %, respectively, further preferably greater than or equal to 34 atomic % and less than 66 atomic %, respectively.

The energy gap of the oxide semiconductor film 388 is 2 eV or more, preferably 2.5 eV or more, further preferably 3 eV or more. With the use of an oxide semiconductor having such a wide energy gap, the off-state current of the transistor can be reduced.

The thickness of the oxide semiconductor film 388 is greater than or equal to 3 nm and less than or equal to 200 nm, preferably greater than or equal to 3 nm and less than or equal to 100 nm, further preferably greater than or equal to 3 nm and less than or equal to 50 nm.

The oxide film 390 is typically an In—Ga oxide, an In—Zn oxide, or an In-M-Zn oxide (M is an element selected from the group consisting of Al, Ga, Ge, Y, Zr, Sn, La, Ce, and Hf). The energy at the bottom of a conduction band thereof is closer to a vacuum level than that of the oxide semiconductor film 388 is, and typically, the difference between the energy at the bottom of the conduction band of the oxide film 390 and the energy at the bottom of the conduction band of the oxide semiconductor film 388 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 390 and the electron affinity of the oxide semiconductor film 388 is any one of 0.05 eV or more, 0.07 eV or more, 0.1 eV or more, and 0.15 eV or more, and any one of 2 eV or less, 1 eV or less, 0.5 eV or less, and 0.4 eV or less.

When the oxide film 390 contains a larger amount of the element M in an atomic ratio than the amount of In in an atomic ratio, any of the following effects may be obtained:

(1) the energy gap of the oxide film 390 is widened;
(2) the electron affinity of the oxide film 390 decreases;
(3) an impurity from the outside is blocked; and
(4) an insulating property of the oxide film 390 increases as compared to the oxide semiconductor film 388.

Moreover, oxygen vacancies are less likely to be generated in the oxide film 390 containing a larger amount of M in an atomic ratio than the amount of In in an atomic ratio because M is a metal element which is strongly bonded to oxygen.

In the case of using an In-M-Zn oxide as the oxide film 390, when Zn and O are eliminated from consideration, the proportions of In and M are preferably less than 50 atomic % and greater than or equal to 50 atomic %, respectively, and further preferably less than 25 atomic % and greater than or equal to 75 atomic %, respectively.

Furthermore, in the case where each of the oxide semiconductor film 388 and the oxide film 390 is an In-M-Zn oxide (M is an element selected from the group consisting of Al, Ga, Ge, Y, Zr, Sn, La, Ce, or Hf), the proportion of M atoms in the oxide film 390 is higher than that in the oxide semiconductor film 388. Typically, the proportion of M in each of the films is 1.5 or more, preferably twice or more, further preferably three or more times as high as that in the oxide semiconductor film 388.

In the case where the oxide film 390 has an atomic ratio of In to M and Zn which is $x_1:y_1:z_1$ and the oxide semiconductor film 388 has an atomic ratio of In to M and Zn which is $x_2:y_2:z_2$, $y_1/x_1$ is larger than $y_2/x_2$, preferably $y_1/x_1$ is 1.5 times or more as large as $y_2/x_2$. It is further preferable that $y_1/x_1$ be twice or more as large as $y_2/x_2$. It is still further preferable that $y_1/x_1$ be three or more times as large as $y_2/x_2$. In this case, it is preferable that in the oxide semiconductor film 388, $y_2$ be greater than or equal to $x_2$ because a transistor including the oxide semiconductor film can have stable electrical characteristics. However, when $y_2$ is three times or more as large as $x_2$, the field-effect mobility of the transistor including an oxide semiconductor is reduced; accordingly, $y_2$ is preferably smaller than three times $x_2$.

In the case where each of the oxide semiconductor film 388 and the oxide film 390 is an In-M-Zn oxide, it is preferable that the atomic ratio of metal elements of a sputtering target used for forming a film of the In-M-Zn oxide satisfy M>In and Zn≥M. As the atomic ratio of metal elements of such a sputtering target, the atomic ratio of In to Ga and Zn is preferably 1:3:2, 1:3:3, 1:3:4, 1:3:5, 1:3:6, 1:3:7, 1:3:8, 1:3:9, 1:3:10, 1:6:4, 1:6:5, 1:6:6, 1:6:7, 1:6:8, 1:6:9, and 1:6:10 are preferable. Note that the proportion of each metal element in the atomic ratio of each of the oxide semiconductor film 388 and the oxide film 390 formed using the above-described sputtering target varies within a range of ±20% as an error.

Note that, without limitation to those described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor films 388 be set to be appropriate.

The oxide film 390 also serves as a film which relieves damage to the oxide semiconductor film 388 at the time of forming the insulating film 312 or 314 later. The thickness of the oxide film 390 is greater than or equal to 3 nm and less than or equal to 100 nm, preferably greater than or equal to 3 nm and less than or equal to 50 nm.

When silicon or carbon, which is one of elements belonging to Group 14, is contained in the oxide semiconductor film 388, the number of oxygen vacancies is increased, and the oxide semiconductor film 388 becomes an n-type film. Thus, the concentration of silicon or carbon (the concentration is measured by SIMS) in the oxide semiconductor film 388 or the concentration of silicon or carbon (the concentration is measured by SIMS) in the vicinity of the interface between the oxide film 390 and the oxide semiconductor film 388 is lower than or equal to $2\times10^{18}$ atoms/cm$^3$, preferably lower than or equal to $2\times10^{17}$ atoms/cm$^3$.

Furthermore, the concentration of alkali metals or alkaline earth metals in the oxide semiconductor film 388, which is measured by SIMS, is lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistors might be increased. Therefore, it is preferable to reduce the concentration of alkali metals or alkaline earth metals of the oxide semiconductor film 388.

Furthermore, when containing nitrogen, the oxide semiconductor film 388 easily has an n-type region by generation of electrons serving as carriers and an increase of carrier density. Thus, a transistor including an oxide semiconductor which contains hydrogen is likely to be normally on. For this reason, nitrogen in the oxide semiconductor film 388 is preferably reduced as much as possible; the concentration of nitrogen which is measured by SIMS is preferably, for example, lower than or equal to $5\times10^{18}$ atoms/cm$^3$.

Note that the oxide semiconductor film 388 and the oxide film 390 are formed to have not only a simple stacked-layer structure of the layers but also a continuous energy band (here, in particular, a structure in which energies of the bottoms of the conduction bands are changed continuously between layers). In other words, the oxide semiconductor film and the oxide film have a stacked-layer structure such that there exist no impurities which form a defect level such as a trap center or a recombination center for the oxide semiconductor film at each interface. If impurities are mixed between the oxide semiconductor film 388 and the oxide film 390 which are stacked, the continuity of the energy band is lost and carriers at the interface disappear by a trap or recombination.

In order to form such a continuous energy band, it is necessary to form films continuously without being exposed to the air, with the use of a multi-chamber deposition apparatus (sputtering apparatus) including a load lock chamber. Each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

Next, a band structure of the stacked-layer structure included in each of the transistors 102 and 103 is described with reference to FIG. 8B.

FIG. 8B schematically shows a part of the band structure included in each of the transistors 102 and 103. Here, the case where silicon oxide layers are provided as the insulating film 306 and the insulating film 312 is shown. In FIG. 8B, EcI1 denotes the energy of the bottom of the conduction band in the silicon oxide layer used as the insulating film 306; EcS1 denotes the energy of the bottom of the conduction band in the oxide semiconductor film 388; EcS2 denotes the energy of the bottom of the conduction band in the oxide film 390; and EcI2 denotes the energy of the bottom of the conduction band in the silicon oxide layer used as the insulating film 312.

As shown in FIG. 8B, there is no energy barrier between the oxide semiconductor film 388 and the oxide film 390, and the energy level of the bottom of the conduction band gradually changes therebetween. In other words, the energy level of the bottom of the conduction band is continuously changed. This is because the oxide semiconductor film 388 contains an element contained in the oxide film 390 and oxygen is transferred between the oxide semiconductor film 388 and the oxide film 390, so that a mixed layer is formed.

As shown in FIG. 8B, the oxide semiconductor film 388 serves as a well and a channel formation region is formed in the oxide semiconductor film 388. Note that since the energies of the bottom of the conduction band of the oxide semiconductor film 388 and the oxide film 390 are continuously changed, it can be said that the oxide semiconductor film 388 and the oxide film 390 are continuous.

Although trap states due to defects or impurities such as silicon or carbon, which is a constituent element of the insulating film 312, might be formed in the vicinity of the interface between the oxide film 390 and the insulating film 312 as shown in FIG. 8B, the oxide semiconductor film 388 can be distanced from the trap states owing to existence of the oxide film 390. However, when the energy difference between EcS1 and EcS2 is small, an electron in the oxide semiconductor film 388 might reach the trap state by passing over the energy difference. When the electron is captured by the trap state, negative fixed electric charge is generated at the interface with the insulating film, so that the threshold voltage of the transistor shifts in the positive direction. Therefore, it is preferable that the energy difference between EcS1 and EcS2 be 0.1 eV or more, further preferably 0.15 eV or more because a change in the threshold voltage of the transistor is prevented and stable electrical characteristics are obtained.

Figure 9A:
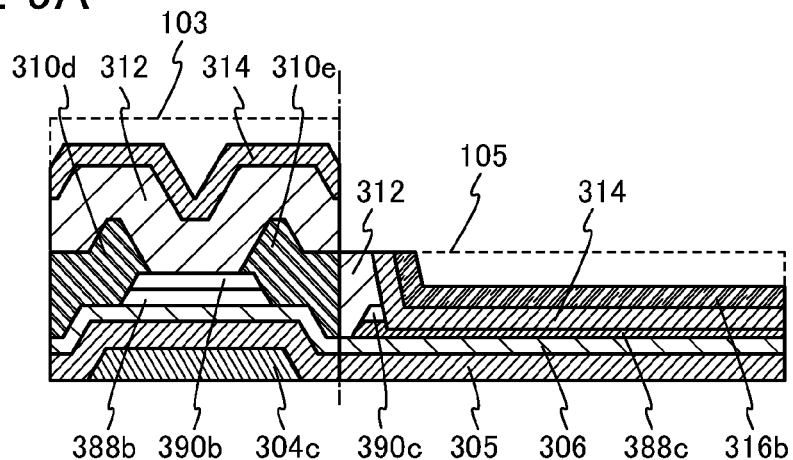
FIGS. 9A to 9C are cross-sectional views each illustrating one embodiment of a display device.

Next, FIG. 9A illustrates an enlarged cross-sectional view of the structures of the transistor 103 and the capacitor 105 illustrated in FIG. 8A.

In the cross-sectional view of FIG. 9A, the transistor 103 includes the oxide semiconductor film 388b in a channel formation region and the oxide film 390b over the oxide semiconductor film 388b. Note that the oxide semiconductor film 388b is provided over the gate insulating film (here, the insulating film 306). The capacitor 105 includes a light-transmitting conductive film 388c as one electrode and the light-transmitting conductive film 316b as the other electrode. Note that the light-transmitting conductive film 388c is formed over the surface over which the oxide semiconductor film 388b is formed (formed over the insulating film 306). In other words, the light-transmitting conductive film 388c has the same composition as the oxide semiconductor film 388b.

Moreover, in the cross-sectional view of FIG. 9A, the thickness of the light-transmitting conductive film 388c is smaller than that of the oxide semiconductor film 388b. The transmittance of the capacitor 105 can be improved by thus forming the light-transmitting conductive film 388c to have a small thickness.

In the structure of FIG. 9A, one electrode of the light-transmitting capacitor 105 corresponds to the light-transmitting conductive film 388c, and has a single-layer structure, which differs from the stacked-layer structure of the oxide semiconductor film 388b used in the channel formation region of the transistor 103 and the oxide film 390b formed over the oxide semiconductor film 388b. Therefore, it is possible to provide a display device including a capacitor whose charge capacity can be increased while improving the transmittance of a pixel portion. Moreover, since the oxide film 390b is formed over the oxide semiconductor film 388b in the transistor 103, a highly reliable display device can be obtained.

Figure 9B:
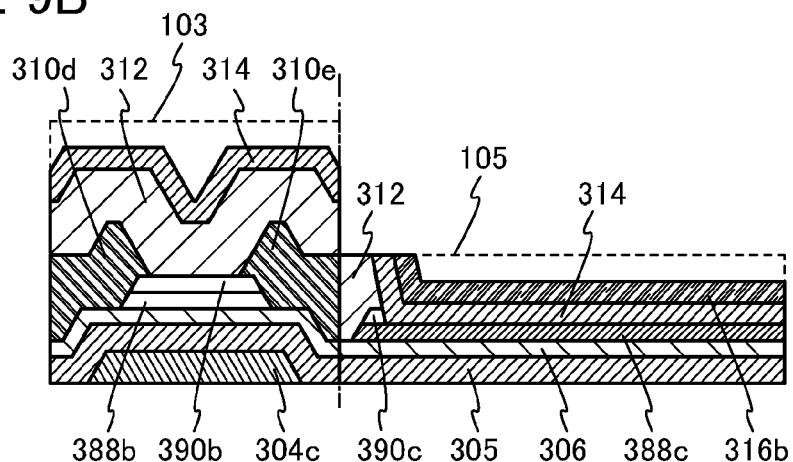

Next, FIG. 9B illustrates a modified example of the cross-sectional structure of the display device illustrated in FIG. 9A.

In the cross-sectional view of FIG. 9B, the transistor 103 includes the oxide semiconductor film 388b in a channel formation region and the oxide film 390b over the oxide semiconductor film 388b. Note that the oxide semiconductor film 388b is provided over the gate insulating film (here, the insulating film 306). The capacitor 105 includes the light-transmitting conductive film 388c as one electrode and the light-transmitting conductive film 316b as the other electrode. Note that the light-transmitting conductive film 388c is formed over the surface over which the oxide semiconductor film 388b is formed (formed over the insulating film 306). In other words, the light-transmitting conductive film 388c has the same composition as the oxide semiconductor film 388b.

The cross-sectional structure of FIG. 9B differs from the cross-sectional structure of FIG. 9A in the thickness of the light-transmitting conductive film 388c. Specifically, in the cross-sectional structure of FIG. 9B, the thickness of the light-transmitting conductive film 388c is substantially the same as that of the oxide semiconductor film 388b. In this manner, only an oxide film 390c over the light-transmitting conductive film 388c may be removed. The transmittance of the capacitor 105 can be improved because the oxide film 390c is not formed, which differs from the oxide semiconductor film 388b and the oxide film 390b of the transistor 103.

Figure 9C:
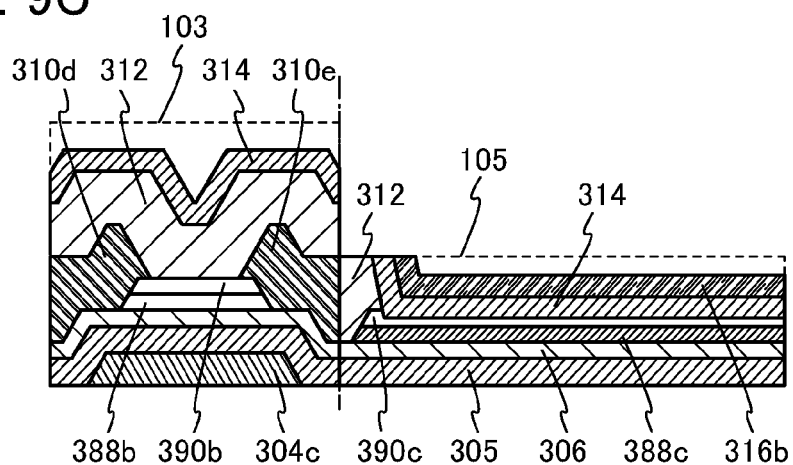

Next, FIG. 9C illustrates another modified example of the cross-sectional structure of the display device illustrated in FIG. 9A.

In the cross-sectional view of FIG. 9C, the transistor 103 includes the oxide semiconductor film 388b in a channel formation region and the oxide film 390b over the oxide semiconductor film 388b. Note that the oxide semiconductor film 388b is provided over the gate insulating film (here, the insulating film 306). The capacitor 105 includes the light-transmitting conductive film 388c and the oxide film 390c collectively as one electrode and the light-transmitting conductive film 316b as the other electrode. Note that the light-transmitting conductive film 388c is formed over the surface over which the oxide semiconductor film 388b is formed (formed over the insulating film 306).

Moreover, in the cross-sectional view of FIG. 9C, the thickness of the oxide film 390c is smaller than that of the oxide film 390b. The transmittance of the capacitor 105 can be improved by thus forming the oxide film 390c to have a small thickness.

Note that the one electrodes of the capacitor 105, the structures of which are illustrated in FIGS. 9A to 9C, can be formed by the following methods.

The light-transmitting conductive film 388c and the oxide film 390c are formed through the same steps as the oxide semiconductor film 388b and the oxide film 390b of the transistor 103. After that, at the formation of the opening 372, the structures of FIGS. 9A and 9B can be obtained by removal of the oxide film 390c formed over the light-transmitting conductive film 388c. Note that the structure of FIG. 9C can be obtained by setting the etching time shorter than that in FIG. 9A.

Moreover, in the structure of FIG. 9C, the one electrode of the capacitor 105 corresponds to the light-transmitting conductive film 388c and the oxide film 390c. Diffusion of hydrogen from the insulating film 314 in contact with the oxide film 390c improves the conductivity of the stack of the light-transmitting conductive film 388c and the oxide film 390c; accordingly, the stack becomes a light-transmitting conductive film.

Modification Example 2

Figure 10:
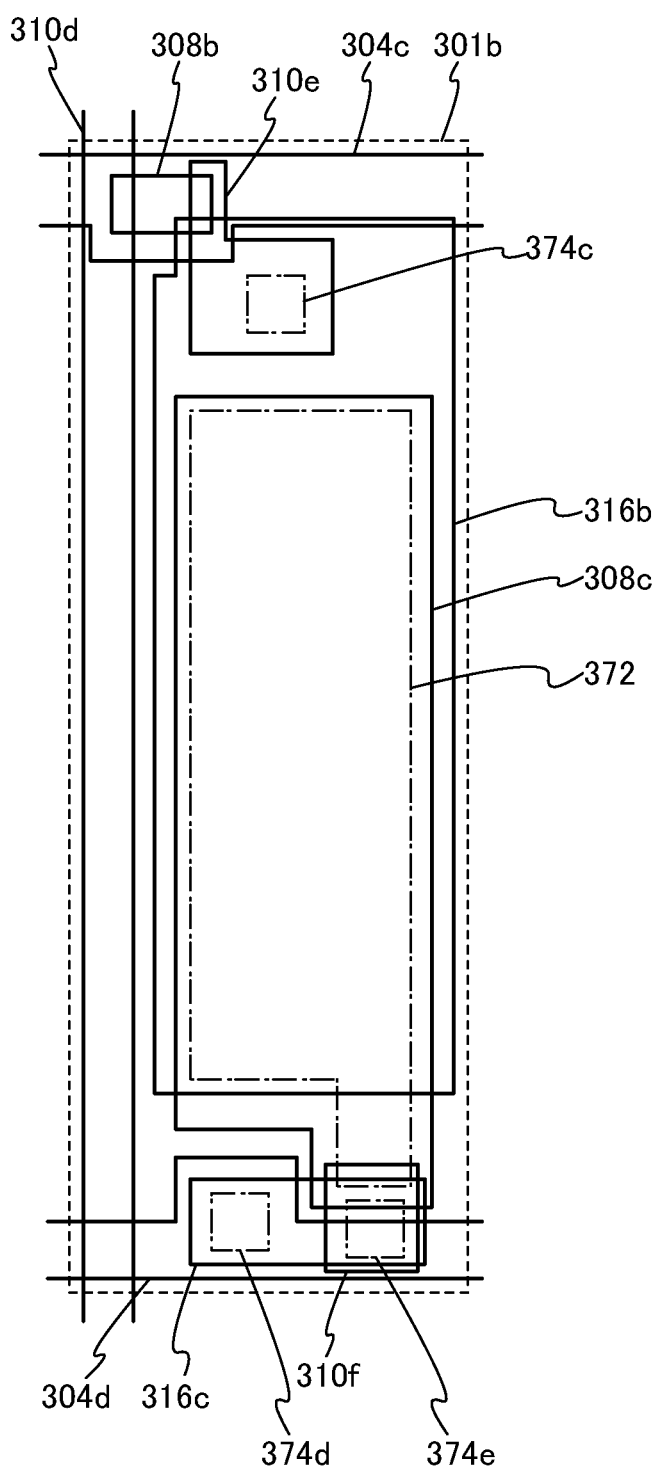
FIG. 10 is a top view illustrating one embodiment of a display device.

Here, a modification example of the pixel 301 of the display device in FIG. 2B is described with reference to FIG. 10. Note that FIG. 10 is a top view of a pixel 301b of the display device, which is a modification example of the pixel 301 of the display device in FIG. 2B. In this manner, the shape of a pixel in a display device can be selected as appropriate by practitioners.

In FIG. 10, the conductive film 304c functioning as the scan line extends substantially perpendicularly to the signal line (in the horizontal direction in the drawing). The conductive film 310d functioning as a signal line extends substantially perpendicularly to the scan line (in the vertical direction in the drawing). A conductive film 304d functioning as a capacitor line extends parallel to the scan line. The pixel 301b in FIG. 10 differs from the pixel 301 in FIG. 2B in that a side parallel to the conductive film 304c functioning as a scan line is shorter than a side parallel to the conductive film 310d functioning as a signal line, the conductive film 304d functioning as a capacitor line extends parallel to the conductive film 304c functioning as the scan line, and the conductive film 304d functioning as the capacitor line is formed at the same time as the conductive film 304c functioning as the scan line.

In addition, the light-transmitting conductive film 308c is connected to the conductive film 310f. Note that the conductive film 310f does not function as a capacitor line in FIG. 10. The conductive film 310f is formed at the same time as the conductive films 310d and 310e.

Furthermore, an opening 374d formed in a manner similar to that of the opening 374c is formed over the conductive film 304d. Moreover, an opening 374e formed in a manner similar to that of the opening 374c is formed over the conductive film 310f.

In the opening 374d, the conductive film 304d is connected to a light-transmitting conductive film 316c. In the opening 374e, the conductive film 310f is connected to the light-transmitting conductive film 316c. In other words, the conductive film 304d and the conductive film 310f are connected to each other through the light-transmitting conductive film 316c. Therefore, through the conductive film 310f and the light-transmitting conductive film 316c, the light-transmitting conductive film 308c is connected to the conductive film 304d functioning as a capacitor line.

The pixel 301 illustrated in FIG. 10 has a shape in which a side parallel to the conductive film 304c functioning as a scan line is shorter than a side parallel to the conductive film 310d functioning as a signal line, and the conductive film 304d functioning as a capacitor line extends parallel to the conductive film 304c functioning as the scan line. As a result, the area where the conductive film 304d occupies the pixel can be decreased, thereby improving the aperture ratio.

As described above, the structure described in this embodiment can be used in an appropriate combination with any other structure described in the other embodiments.

Embodiment 2

In this embodiment, an example of an oxide semiconductor film that can be used for the transistor and the capacitor of the display device described in Embodiment 1 is described.
<Crystallinity of Oxide Semiconductor Film>

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Moreover, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states.

In a transistor using the CAAC-OS film, a change in electrical characteristics due to irradiation with visible light or ultraviolet light is small. Thus, the transistor has high reliability.

Next, a microcrystalline oxide semiconductor film is described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a boundary between crystal parts is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction area) of the nc-OS film obtained by using an electron beam having a diameter (e.g., larger than or equal to 50 nm) larger than the diameter of a crystal part. Meanwhile, spots are shown in a nanobeam electron diffraction pattern of the nc-OS film obtained by using an electron beam having a diameter (e.g., larger than or equal to 1 nm and smaller than or equal to 30 nm) close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more layers of an amorphous oxide semiconductor film, a microcrystalline oxide semiconductor film, and a CAAC-OS film, for example.

<Formation Method of CAAC-OS Film>

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or pellet-like sputtered particle reaches a substrate while maintaining their crystal state, whereby the CAAC-OS film can be formed.

The flat-plate-like sputtered particle or pellet-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm Note that in the flat-plate-like sputtered particle or pellet-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like sputtered particles or pellet-like sputtered particle reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is higher than or equal to 100° C. and lower than or equal to 500° C., preferably higher than or equal to 150° C. and lower than or equal to 450° C., and the proportion of oxygen in a deposition gas is higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is higher than or equal to 100° C. and lower than or equal to 500° C., preferably higher than or equal to 150° C. and lower than or equal to 450° C., and the proportion of oxygen in a deposition gas is higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

As described above, a CAAC-OS film with a total thickness of greater than or equal to 10 nm can be formed. The CAAC-OS film can be favorably used as the oxide semiconductor film in the oxide stack.

Next, a method for forming an oxide film in the case where a formation surface has a low temperature (e.g., a temperature lower than 130° C., lower than 100° C., or lower than 70° C., or about a room temperature (20° C. to 25° C.)) because, for example, the substrate is not heated is described.

In the case where the formation surface has a low temperature, sputtered particles fall irregularly to the deposition surface. For example, migration does not occur; therefore, the sputtered particles are randomly deposited on the deposition surface including a region where other sputtered particles have been deposited. That is, an oxide film obtained by the deposition might have a non-uniform thickness and a disordered crystal alignment. The oxide film obtained in the above manner maintains the crystallinity of the sputtered particles to a certain degree and thus has a crystal part (nanocrystal).

For example, in the case where the pressure at the deposition is high, the frequency with which the flying sputtered particle collides with another particle (e.g., an atom, a molecule, an ion, or a radical) of argon or the like is increased. When the flying sputtered particle collides with another particle (resputtered), the crystal structure of the sputtered particle might be broken. For example, when the sputtered particle collides with another particle, the plate-like shape of the sputtered particle cannot be kept, and the sputtered particle might be broken into parts (e.g., atomized). At this time, when atoms obtained from the sputtered particle are deposited on the formation surface, an amorphous oxide film might be formed.

In the case where not a sputtering method using a target including polycrystalline oxide but a deposition method using liquid or a method for depositing a film by vaporizing a solid such as a target is used, the atoms separately fly to be deposited over the formation surface; therefore, an amorphous oxide film might be formed. Moreover, for example, by a laser ablation method, atoms, molecules, ions, radials, clusters, or the like released from the target flies to be deposited over the formation surface; therefore, an amorphous oxide film might be formed.

An oxide semiconductor film included in the transistor and the capacitor of the display device of one embodiment of the present invention may have any of the above crystal states.

Moreover, in the case of stacked oxide semiconductor films, the crystal states of the oxide semiconductor films may be different from each other. Note that the CAAC-OS film is preferably used as the oxide semiconductor film functioning as the channel formation region of the transistor. Furthermore, the oxide semiconductor film (the light-transmitting conductive film) included in the capacitor has a higher impurity concentration than the oxide semiconductor film included in the transistor; thus, the crystallinity of the capacitor is lowered in some cases.

As described above, the structure described in this embodiment can be used in an appropriate combination with any other structure described in the other embodiments.

Embodiment 3

In this embodiment, a display module and an electronic device that can be formed using the display device of one embodiment of the present invention will be described with reference to FIG. 11 and FIGS. 12A to 12H.

Figure 11:
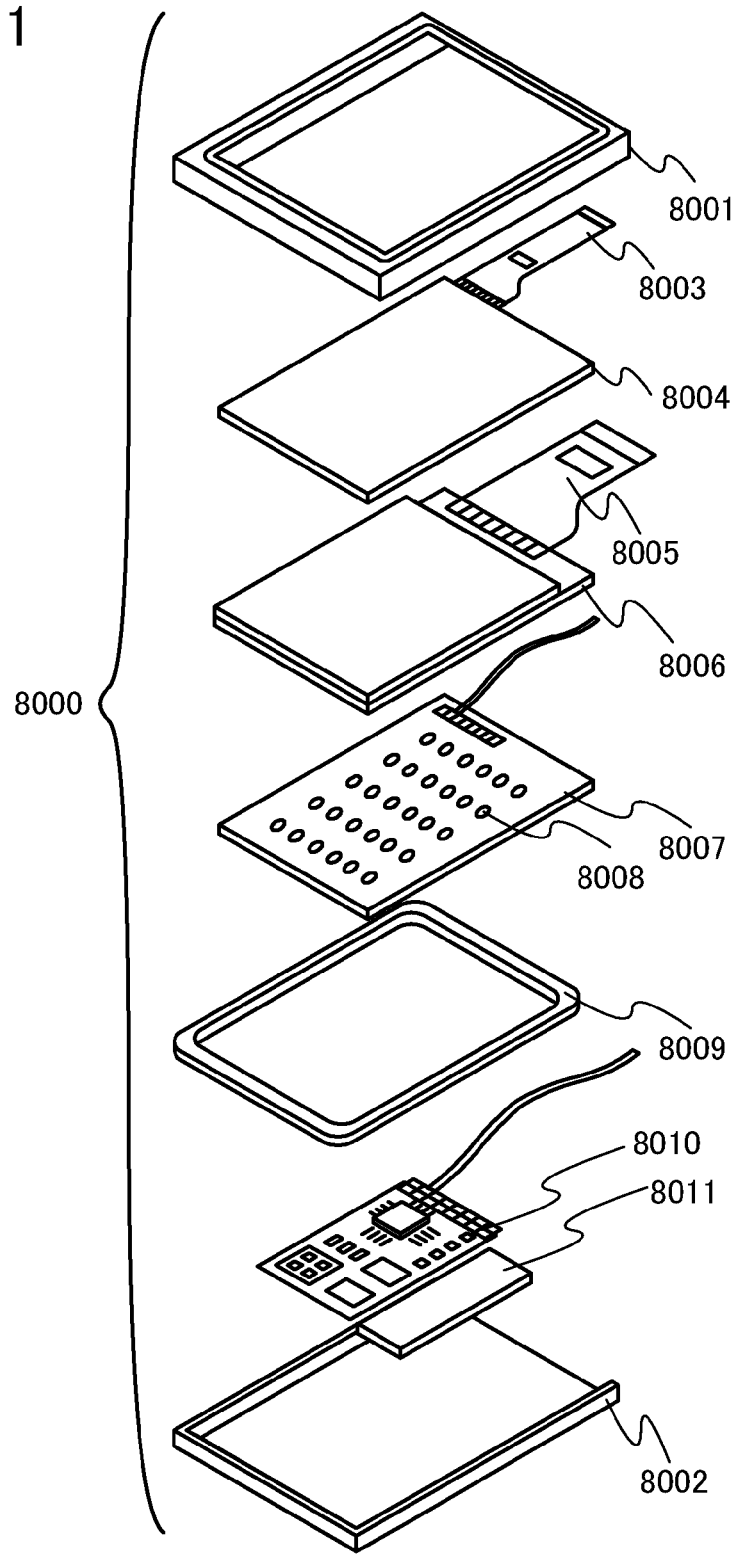
FIG. 11 illustrates a display module.

In a display module 8000 illustrated in FIG. 11, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 12A to 12H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 12A:
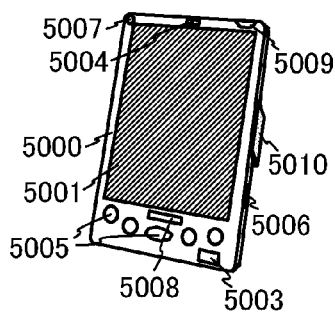
FIGS. 12A to 12H illustrate electronic devices.
Figure 12B:
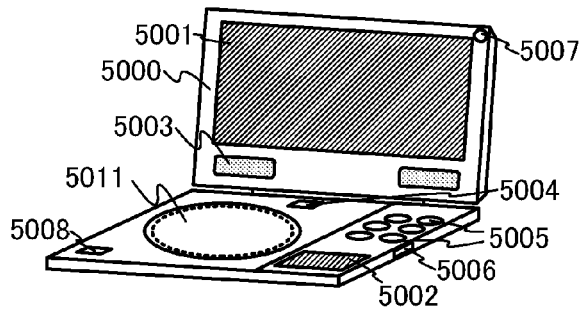
Figure 12C:
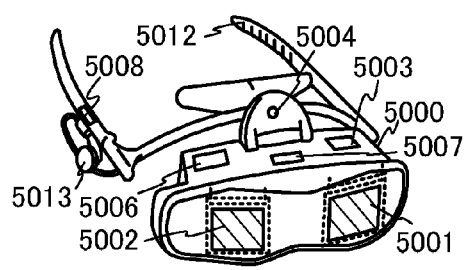
Figure 12D:
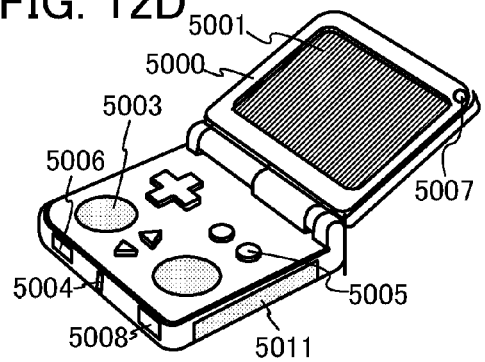
Figure 12E:
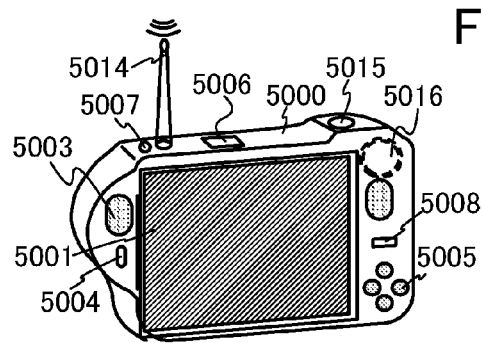
Figure 12F:
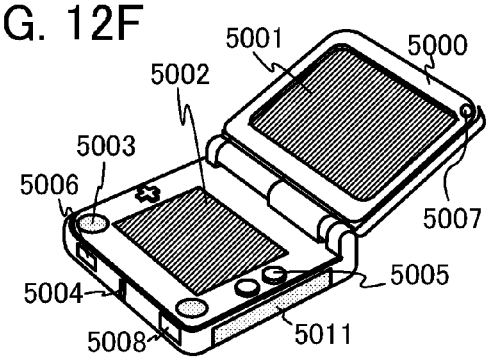
Figure 12G:
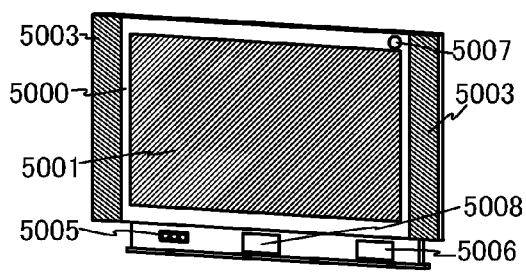
Figure 12H:
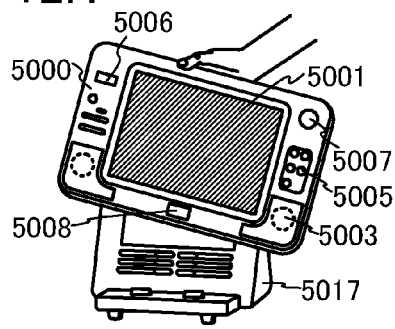

FIG. 12A illustrates a mobile computer, which can include a switch 5009, an infrared port 5010, and the like in addition to the above components. FIG. 12B illustrates a portable image reproducing device (e.g., a DVD player), which is provided with a memory medium and can include a second display portion 5002, a memory medium reading portion 5011, and the like in addition to the above components. FIG. 12C illustrates a goggle-type display, which can include the second display portion 5002, a support 5012, an earphone 5013, and the like in addition to the above components. FIG. 12D illustrates a portable game machine, which can include the memory medium reading portion 5011 and the like in addition to the above components. FIG. 12E illustrates a digital camera, which has a television reception function and can include an antenna 5014, a shutter button 5015, an image receiving portion 5016, and the like in addition to the above components. FIG. 12F illustrates a portable game machine, which can include the second display portion 5002, the memory medium reading portion 5011, and the like in addition to the above components. FIG. 12G illustrates a television receiver, which can include a tuner, an image processing portion, and the like in addition to the above components. FIG. 12H illustrates a portable television receiver, which can include a charger 5017 capable of transmitting and receiving signals, and the like in addition to the above components.

The electronic devices illustrated in FIGS. 12A to 12H can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on a display portion can be given. Moreover, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions which can be provided for the electronic devices illustrated in FIGS. 12A to 12H are not limited to those described above, and the electronic devices can have a variety of functions.

The electronic devices described in this embodiment each include the display portion for displaying some sort of data.

The structure described in this embodiment can be used in an appropriate combination with any other structure described in the other embodiments.

This application is based on Japanese Patent Application serial No. 2013-097195 filed with the Japan Patent Office on May 3, 2013, the entire contents of which are hereby incorporated by reference.

What is claimed is:

1. A display device comprising:
   a transistor comprising a first oxide semiconductor film in a channel formation region, the first oxide semiconductor film over and in contact with a first insulating film;
   a second oxide semiconductor film over and in contact with the first insulating film;
   a pixel electrode electrically connected to the transistor; and
   a light-transmitting capacitor comprising the pixel electrode, a dielectric film and the second oxide semiconductor film, wherein the dielectric film is provided between the second oxide semiconductor film and the pixel electrode,
   wherein a thickness of the second oxide semiconductor film is smaller than a thickness of the first oxide semiconductor film.

2. The display device according to claim 1,
   wherein each of the first oxide semiconductor film and the second oxide semiconductor film comprises an In-M-Zn oxide, and
   wherein M is an element selected from the group consisting of Al, Ti, Ga, Y, Zr, La, Ce, Nd, or Hf.

3. The display device according to claim 1, further comprising a first oxide film over and in contact with the first oxide semiconductor film.

4. The display device according to claim 3,
   wherein each of the first oxide semiconductor film, the second oxide semiconductor film, and the first oxide film comprises an In-M-Zn oxide,
   wherein M is an element selected from the group consisting of Al, Ti, Ga, Y, Zr, La, Ce, Nd, or Hf, and
   wherein an atomic ratio of M contained in the first oxide film is higher than an atomic ratio of M contained in each of the first oxide semiconductor film and the second oxide semiconductor film.

5. The display device according to claim 1, further comprising a second insulating film over the first oxide semiconductor film,
   wherein the dielectric film comprises a nitride insulating film,
   wherein the nitride insulating film is over the second insulating film, and
   wherein the nitride insulating film is in contact with the second oxide semiconductor film.

6. The display device according to claim 5, wherein the second insulating film is an oxide insulating film which contains oxygen at a higher proportion than oxygen in a stoichiometric composition of the oxide insulating film.

7. The display device according to claim 1, wherein the thickness of the second oxide semiconductor film is half or less than the thickness of the first oxide semiconductor film.

8. The display device according to claim 1, wherein a transmittance of the second oxide semiconductor film is greater than a transmittance of the first oxide semiconductor film.

9. The display device according to claim 1, wherein the pixel electrode comprises at least one oxide selected from the group consisting of indium oxide, tin oxide, and zinc oxide.

10. An electronic device comprising the display device according to claim 1.

11. A display device comprising:
    a transistor comprising a first oxide semiconductor film in a channel formation region, the first oxide semiconductor film over and in contact with a first insulating film;
    A first oxide film over and in contact with the first oxide semiconductor film;
    a second oxide semiconductor film over and in contact with the first insulating film;
    a pixel electrode electrically connected to the transistor; and a light-transmitting capacitor comprising the pixel electrode, a dielectric film and the second oxide semiconductor film, wherein the dielectric film is provided between the second oxide semiconductor film and the pixel electrode, wherein a thickness of the second oxide semiconductor film is smaller than a thickness of the first oxide semiconductor film.

12. The display device according to claim 11,
wherein each of the first oxide semiconductor film, the second oxide semiconductor film, the first oxide film, and the second oxide film comprises an In-M-Zn oxide,
wherein M is an element selected from the group consisting of Al, Ti, Ga, Y, Zr, La, Ce, Nd, or Hf, and
wherein an atomic ratio of M contained in each of the first oxide film and the second oxide film is higher than an atomic ratio of M contained in each of the first oxide semiconductor film and the second oxide semiconductor film.

13. The display device according to claim 11, further comprising a second insulating film over the first oxide film,
wherein the dielectric film comprises a nitride insulating film,
wherein the nitride insulating film is over the second insulating film, and
wherein the nitride insulating film is in contact with the second oxide film.

14. The display device according to claim 13, wherein the second insulating film is an oxide insulating film which contains oxygen at a higher proportion than oxygen in a stoichiometric composition of the oxide insulating film.

15. The display device according to claim 11, wherein the pixel electrode comprises at least one oxide selected from the group consisting of indium oxide, tin oxide, and zinc oxide.

16. An electronic device comprising the display device according to claim 11.

17. A display device comprising:
a first insulating film;
an oxide semiconductor film over the first insulating film;
a transistor comprising:
  a gate electrode;
  a portion of the first insulating film over the gate electrode;
  a first portion of the oxide semiconductor film overlapping with the gate electrode; and
  a pair of electrodes over the first portion of the oxide semiconductor film;
a pixel electrode electrically connected to one of the pair of electrodes;
a light-transmitting capacitor comprising:
  a second portion of the oxide semiconductor film;
  a dielectric film over the second portion of the oxide semiconductor film; and
  the pixel electrode over the dielectric film,
wherein a thickness of the second portion of the oxide semiconductor film is smaller than a thickness of the first portion of the oxide semiconductor film, and
wherein the first portion of the oxide semiconductor film and the second portion of the oxide semiconductor film are separated from each other.

18. The display device according to claim 17, further comprising a second insulating film over the first portion of the oxide semiconductor film,
wherein the dielectric film comprises a nitride insulating film,
wherein the nitride insulating film is over the second insulating film, and
wherein the nitride insulating film is in contact with the second portion of the oxide semiconductor film.

19. The display device according to claim 18, wherein the second insulating film is an oxide insulating film which contains oxygen at a higher proportion than oxygen in a stoichiometric composition of the oxide insulating film.

20. The display device according to claim 17, wherein the thickness of the second portion of the oxide semiconductor film is half or less than the thickness of the first portion of the oxide semiconductor film.

21. The display device according to claim 17, wherein a transmittance of the second portion of the oxide semiconductor film is greater than a transmittance of the first portion of the oxide semiconductor film.

22. The display device according to claim 17, wherein the pixel electrode comprises at least one oxide selected from the group consisting of indium oxide, tin oxide, and zinc oxide.

23. An electronic device comprising the display device according to claim 17.

* * * * *

UNITED STATES PATENT AND TRADEMARK OFFICE
CERTIFICATE OF CORRECTION

| | | |
|---|---|---|
| PATENT NO. | : 9,231,002 B2 | Page 1 of 1 |
| APPLICATION NO. | : 14/263281 | |
| DATED | : January 5, 2016 | |
| INVENTOR(S) | : Yoshiaki Oikawa et al. | |

It is certified that error appears in the above-identified patent and that said Letters Patent is hereby corrected as shown below:

In the specification,

At column 29, line 39, "20" should be --2$\theta$--;

At column 31, line 47, "1 nm Note" should be --1 nm. Note--;

In the claims,

In claim 11, column 36, line 61, "A first oxide" should be --a first oxide--;

In claim 11, column 36, between lines 64 and 65 insert the omitted indented phrase --a second oxide film over and in contact with the second oxide semiconductor film;-- between "a second oxide semiconductor film..." and "a pixel electrode...";

In claim 11, column 37, line 4, "oxide semiconductor film" should be --oxide film--;

In claim 11, column 37, lines 6-7, "oxide semiconductor film" should be --oxide film--;

In claim 11, column 37, lines 7-8, "oxide semiconductor film" should be --oxide film--.

Signed and Sealed this
Fourteenth Day of June, 2016

Michelle K. Lee
*Director of the United States Patent and Trademark Office*